US012580814B2

(12) United States Patent
Aziz et al.

(10) Patent No.: US 12,580,814 B2
(45) Date of Patent: *Mar. 17, 2026

(54) ADAPTING FORWARD ERROR CORRECTION (FEC) OR LINK PARAMETERS FOR IMPROVED POST-FEC PERFORMANCE

(71) Applicant: NVIDIA Corporation, Santa Clara, CA (US)

(72) Inventors: Pervez Mirza Aziz, Dallas, TX (US); Vishnu Balan, Saratoga, CA (US); Rohit Rathi, Milpitas, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/770,877

(22) Filed: Jul. 12, 2024

(65) Prior Publication Data

US 2024/0364451 A1 Oct. 31, 2024

Related U.S. Application Data

(63) Continuation-in-part of application No. 18/112,406, filed on Feb. 21, 2023, now Pat. No. 12,267,210.

(60) Provisional application No. 63/434,753, filed on Dec. 22, 2022.

(51) Int. Cl.
*H04L 41/0823* (2022.01)
*H03M 13/35* (2006.01)
*H04L 1/20* (2006.01)

(52) U.S. Cl.
CPC ...... *H04L 41/0823* (2013.01); *H03M 13/353* (2013.01); *H04L 41/0836* (2013.01); *H04L 1/203* (2013.01)

(58) Field of Classification Search
CPC ............ H04L 41/0823; H04L 41/0836; H03M 13/353
See application file for complete search history.

(56) References Cited

U.S. PATENT DOCUMENTS 6,577,696 B1 * 6/2003 Burgmeier ............ H04L 25/063
375/376
7,899,124 B2 * 3/2011 Heise .................... H04L 1/0009
375/296

(Continued)

OTHER PUBLICATIONS

Liu C Y., "100+ GB/s Ethernet Forward Error Correction (FEC) Analysis," Signal Integrity Journal, Jul. 9, 2019, 25 Pages.

*Primary Examiner* — Joseph D Torres
(74) *Attorney, Agent, or Firm* — Lowenstein Sandler LLP

(57) ABSTRACT

Technologies for optimizing post-FEC bit error rate performance of a Forward Error Correction (FEC) system are described. A controller is coupled to an FEC circuit and a receiver circuit. The controller receives FEC symbol error data from at least the receiver circuit or the FEC circuit and determines, using the FEC symbol error data, a post-FEC correlated performance metric indicative of an estimated post-FEC BER of the FEC circuit. The controller adjusts, based on the post-FEC correlated performance metric, at least one of a FEC parameter of the FEC circuit or a link parameter of the receiver circuit to decrease the estimated post-FEC BER. This improves the post-FEC BER performance of the FEC circuit.

26 Claims, 16 Drawing Sheets

(56)  References Cited

U.S. PATENT DOCUMENTS

| | | | | |
|---|---|---|---|---|
| 8,462,835 B2 * | 6/2013 | Tzannes | ................. | H04L 5/006 |
| | | | | 375/284 |
| 10,439,761 B1 * | 10/2019 | Pandey | ................ | H04L 1/0025 |
| 2002/0105928 A1 * | 8/2002 | Kapoor | ................. | H01Q 1/246 |
| | | | | 370/347 |
| 2004/0208414 A1 * | 10/2004 | Lee | ........................ | H04J 14/08 |
| | | | | 385/24 |
| 2005/0138524 A1 * | 6/2005 | Cioffi | ................. | H04L 12/2874 |
| | | | | 714/758 |
| 2006/0236192 A1 * | 10/2006 | Friddell | ........... | H03M 13/6561 |
| | | | | 714/755 |
| 2008/0112472 A1 * | 5/2008 | Oksman | ............... | H04L 5/1446 |
| | | | | 375/222 |
| 2009/0044232 A1 * | 2/2009 | Narahari | ........... | H04N 21/6112 |
| | | | | 725/62 |
| 2022/0014315 A1 * | 1/2022 | Kong | ................... | H04L 1/1812 |

* cited by examiner

CONTROLLER CAN OPTIMIZE POST-FEC BER PERFORMANCE USING A CLASS OF POST-FEC CORRELATED PERFORMANCE METRICS TO CONTROL EITHER ENC/DEC LAYER PARAMETERS (RSIL) OR LINK PARAMETERS (E.G., SERDES PARAMETERS).

FEC SYSTEM

*300*

*302* — Start with
RSIL=1
*ccnt=1*

*304* — Apply RSIL

*306* — Record FEC Symbol Error
CW Histogram Bin Statistic
Number of Bit Errors

YES    *308*    *Ncw* — *318*

*ccnt <
Ncw ?*

NO

*310* — Compute pre-FEC *ber*
Compute CW Histogram $h_m(i,ber)$
Compute or LUT log10 of CW
Histogram: $h_m(i,ber)$

*312* — Look up $h_{tl}(i,ber)$
Compute *diffmetcw*

*314* — *Is diffmetcw <
diffmet_targ ?*    YES    DONE

NO

*316* — Increase RSIL to next
allowed RSIL value (B)
RSIL=8

(A)
RSIL=1

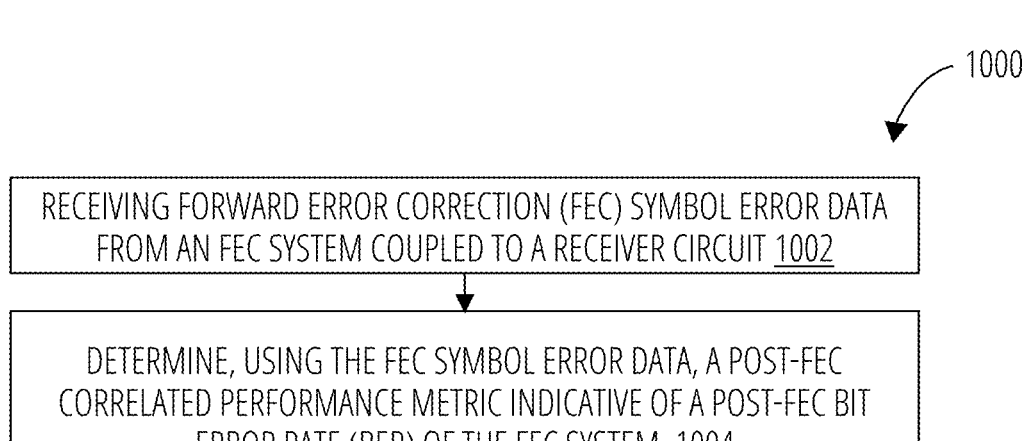

1000

RECEIVING FORWARD ERROR CORRECTION (FEC) SYMBOL ERROR DATA FROM AN FEC SYSTEM COUPLED TO A RECEIVER CIRCUIT 1002

DETERMINE, USING THE FEC SYMBOL ERROR DATA, A POST-FEC CORRELATED PERFORMANCE METRIC INDICATIVE OF A POST-FEC BIT ERROR RATE (BER) OF THE FEC SYSTEM 1004

ADJUST AT LEAST ONE OF AN FEC PARAMETER OF THE FEC SYSTEM OR A LINK PARAMETER OF THE RECEIVER CIRCUIT TO REDUCE THE POST-FEC BER OF THE FEC SYSTEM 1006

FIG. 10

ADAPTING FORWARD ERROR CORRECTION (FEC) OR LINK PARAMETERS FOR IMPROVED POST-FEC PERFORMANCE

RELATED APPLICATIONS

This application is a continuation-in-part of U.S. application Ser. No. 18/112,406, filed Feb. 21, 2023, which claims the benefit of U.S. Application No. 63/434,753, filed Dec. 22, 2022, the entire contents of which are incorporated herein by reference.

TECHNICAL FIELD

At least one embodiment pertains to processing resources used to perform high-speed communications. For example, at least one embodiment pertains to technology for optimizing Forward Error Correction (FEC) performance by adapting FEC parameters or link parameters to improve post-FEC bit error rate (BER) performance.

BACKGROUND

Communication systems employ an architecture with a combination of a transmitter/receiver circuit (e.g., Serializer/Deserializer (SerDes) circuit) in conjunction with a Forward Error Correction (FEC) system for the transmission of signals from a transmitter to a receiver via a communication channel or medium (e.g., cables, printed circuit boards, optical fibers, etc.). The FEC system can be used to optimize equalization of the signal over the communication channel to achieve a desired bit error ratio (BER). For example, an FEC encoder encodes data on the transmit side before using a SerDes transmitter (TX) to transmit the data through a communication channel. The SerDes receiver (RX) receives an analog input signal at the output of the communication channel, and recovers the data as a decoded binary bit stream while achieving a certain BER performance (called "pre-FEC BER performance") before sending that data through an FEC decoder to further improve the BER.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 10 is a flow diagram of a method for adjusting at least one of an FEC parameter or a link parameter to reduce a post-FEC BER performance according to at least one embodiment.

DETAILED DESCRIPTION

Figure 1A:
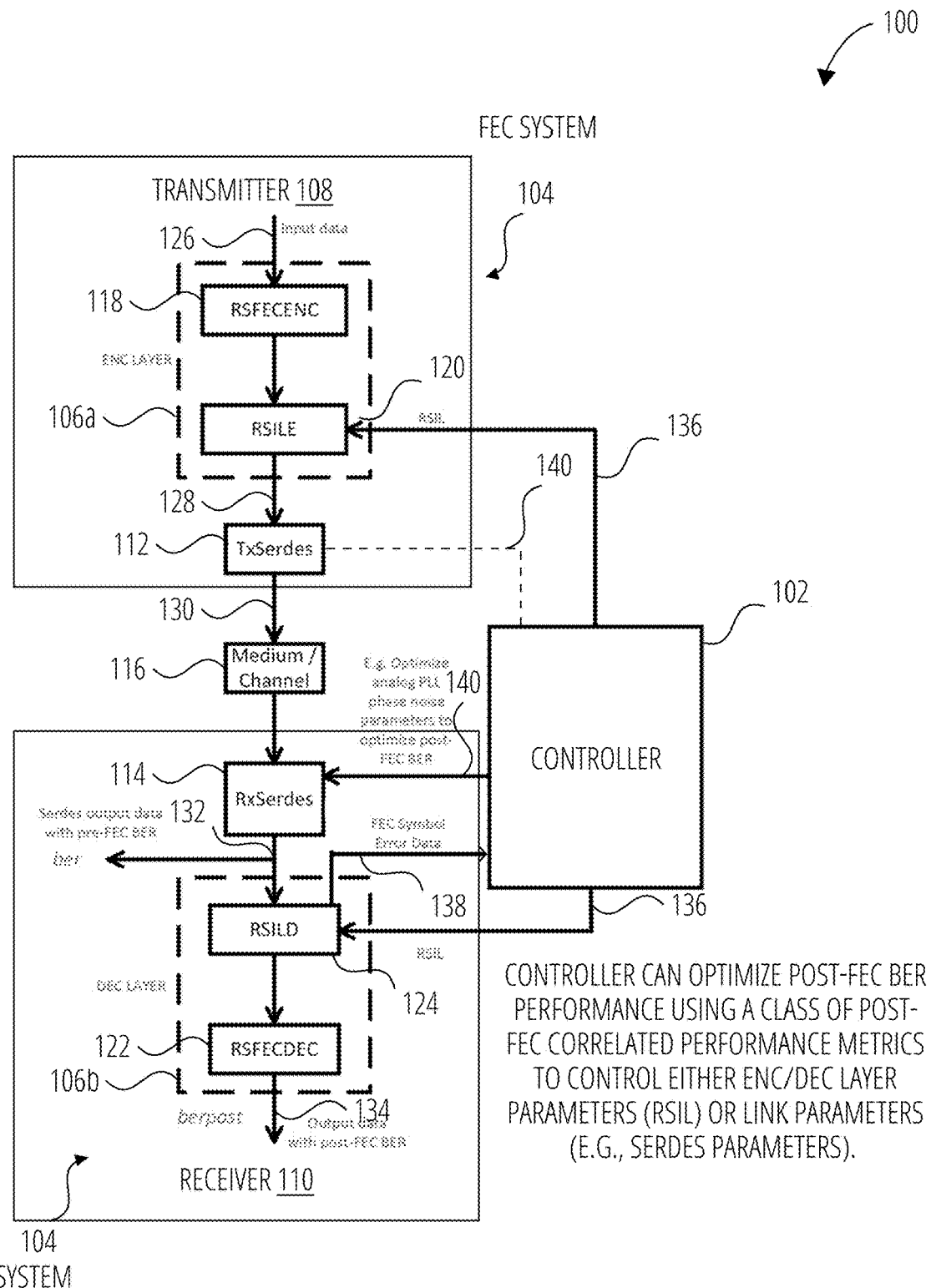
FIG. 1A is a block diagram of a communication system having a controller to optimize post-FEC BER performance of an FEC system using a post-FEC correlated performance metric according to at least one embodiment.

As described above, communication systems employ a transmitter/receiver circuit (e.g., Serializer/Deserializer (SerDes) circuit) and an FEC system, including an FEC encoder encodes data on the transmit side before using the transmitter (TX) to transmit the data through a communication channel. The receiver (RX) receives an analog input signal at the output of the communication channel, and recovers the data as a decoded binary bit stream while achieving a certain BER performance before sending that data through an FEC decoder to further improve the BER. The FEC system may perform data interleaving of various types. There are FEC-related parameters that can be adjusted, but these parameters are usually static in a system thus locking the system into a specific apriori chosen performance/power/latency tradeoff, where the latency is latency through the FEC system. The TX/RX hardware (e.g., SerDes hardware), on the other hand, often has many link parameters it adapts either directly on the SerDes hardware or through the use of an external controller. However, the external controller uses these link parameters to optimize the SerDes performance based on some pre-FEC performance criteria. That is, the controller measures the pre-FEC BER performance to optimize the SerDes parameters. There is no practical way to measure the post-FEC BER performance of the FEC system at low post-FEC BER values where a system would typically operate at. Thus, conventional systems do not use link or FEC-related parameters to optimize the post-FEC BER performance of the FEC systems.

Aspects and embodiments of the present disclosure address these and other challenges by providing adaptation metrics reflective of post-FEC BER performance to optimize post-FEC BER performance of an FEC system. The adaptation metrics are referred to herein as post-FEC correlated performance metric. Aspects and embodiments of the present disclosure provide different adaptation metrics that correlate well with post-FEC BER performance. By using the adaptation metrics, the FEC-related parameters and/or link parameters can be dynamically adapted to optimize the post-FEC BER performance tradeoffs with respect to latency, for example. The link parameters, such as SerDes parameters, can also be adapted for post-FEC BER performance, unlike conventional systems that uses the SerDes parameter adaptation to optimize pre-FEC BER performance. Aspects and embodiments of the present disclosure have the ability to (i) adapt FEC system parameters and/or (ii) link parameters to optimize post-FEC BER performance through the use of different adaptation metrics reflective of post-FEC BER performance. Aspects and embodiments of the present disclosure can use different classes of post-FEC correlated performance metrics. One class of metrics can be based on comparing a measured FEC codeword histogram to a desired target histogram to compute a codeword histogram difference metric. Another class of metrics can be based on computing a FEC symbol error auto-correlation function. The metrics can be referred to as post-FEC performance metrics.

Aspects and embodiments of the present disclosure can be applied to any communication system employing forward error correction. The communication system can include serial links (e.g., printed circuit board (PCB) links, copper cables, optical links, read channels (e.g., systems including but not limited to serial links (pcb/copper cable/optical links etc.), read channel applications (e.g., hard disk, flash SSDs application), or the like. The communication system can be implemented in a personal computer (PC), a set-top box (STB), a server, a network router, a switch, a bridge, a data processing unit (DPU), a network card, or any device capable of sending signals over a communication channel to another device.

FIG. 1A is a block diagram of a communication system 100 having a controller 102 to optimize post-FEC BER performance of an FEC system 104 using a post-FEC correlated performance metric according to at least one embodiment. The communication system 100 includes a transmitter 108 (also referred to as a transmitter device or transmitting device), a receiver 110 (also referred to as a receiver device or receiving device), and the controller 102 operatively coupled to the receiver circuit 114, the transmitter circuit 112, and the FEC system 104, as described in more detail below. In this embodiment, the FEC system 104 includes a single FEC engine, such as a Reed-Solomon (RS) FEC engine, with an RS code and RS interleaving (RSILE, RSILD). In other embodiments, other error correcting codes can be used, such as a Bose-Chaudhuri-Hocquenghem code (BCH code) and BCH interleaving (BCHILE, BCHILD), Hamming codes, extended Hamming codes, Golay codes, parity codes, multidimensional parity codes, triple modular redundancy codes, Nordstrom-Robinson codes, cyclic redundancy checks (CRC) codes, or the like.

In at least one embodiment, the transmitter 108 is part of a first transceiver that also includes a receiver (not illustrated in FIG. 1A) and the receiver 110 is part of a second transceiver that also includes a transmitter (not illustrated in FIG. 1A). The transmitter 108 includes a transmitter circuit 112, such as a SerDes TX circuit. The transmitter circuit 112 sends signals over a communication channel 116 (also referred to as "channel," "communication medium," or "transmission medium." The receiver 110 includes a receiver circuit 114, such as a SerDes RX circuit. The receiver circuit 114 receives signals over the communication channel 116.

In at least one embodiment, the FEC system 104 includes an encoding layer 106a at the transmitter 108 and a decoding layer 106b at the receiver 110. The encoding layer 106a can encode input data 126 (e.g., user or input bits) into forward error correction (FEC) codewords 128. In at least one embodiment, the FEC system 104 uses Reed-Solomon (RS) FEC algorithm. The FEC encoder 118 can thus be an RS FEC encoder (RSFECENC). Other encoding operations may be performed in the encoding layer 106a (and decoding operations in the decoding layer 106b). In other embodiments, other encoding operations can be performed in the transmitter circuit 112 and receiver circuit 114, such as precoding, Gray coding, run length encoding, or the like. During the encoding process, the FEC encoder 118 (e.g., RSFECENC) usually processes groups of bits called FEC symbols, which are typically groups of say 8 or 10 bits at a time, and then FEC codewords 128, which depending on the FEC, can include many FEC symbols. After the encoding process, the transmitter circuit 112 (e.g., SerDes TX circuit sends the equivalent binary bits in a bit stream 130 as an analog waveform through communication channel 116. The receiver circuit 114 (e.g., SerDes RX circuit) processes the analog signal, performing operations, such as equalization/ detection, clock/data recovery, and produces a bit stream 132, which in the absence of impairments or noise in the communication channel 116 would match the transmitted bit stream 130.

It should be noted that the bits of the bit stream 132, at the output of the receiver circuit 114 (e.g., SerDes RX circuit), are produced with a finite pre-FEC BER. This finite pre-FEC BER can be high. These pre-FEC bits at the output of the receiver circuit 114 (e.g., SerDes RX circuit) are typically grouped again as FEC symbols for the decoding layer 106b. During the decoding process, the FEC decoder 122 decodes the RX SerDes output to produce output data 134. The underlying bits of the output data 134 have significantly better (i.e., lower) post-FEC BER than the pre-FEC BER observed at the SerDes RX output. In at least one embodiment, the FEC decoder 122 is a RS decoder (e.g., RSFEC-DEC). Other encoding and decoding FEC algorithms can be used for the encoding layer 106a and decoding layer 106b. It should be noted that the terms encoding/decoding layers are generic terms, but the functionality of these layers can be found in systems that use other terminologies, such as physical coding sub-layer (PCS), or the like. Other standards bodies may have other names for where such functionality resides.

Figure 2:
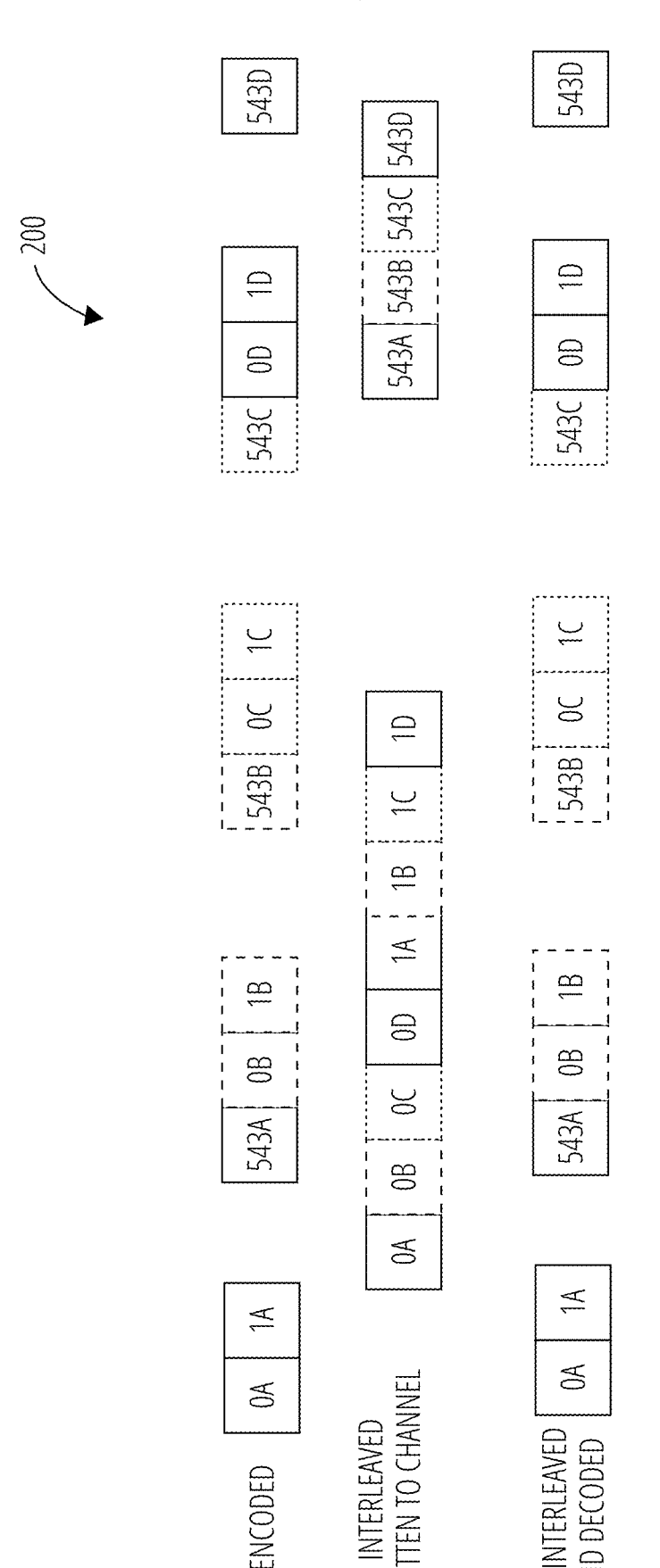
FIG. 2 illustrates an example of FEC symbol interleaving with an interleave factor of four for an encoded FEC codeword according to at least one embodiment.

In addition, interleaving may be applied in conjunction with the FEC system. In at least one embodiment, the encoding layer 106a can include the FEC encoder 118 and a first interleaver 120. In at least one embodiment, the decoding layer 106b can include the FEC decoder 122 and a second interleaver 124. The second interleaver 124 may also be called a 'de-interleaver." This interleaving for the FEC encoder 118 (RSFEC) is denoted as RSILE for the first interleaver 120 in the encoding layer 106a and RSILD for the second interleaver 124 in the decoding layer 106b. The interleaving may be of various types either operating on bits, pairs of bits, or FEC symbols. Depending on the interleaver type, the first interleaver 120 reorders groups of bits, pairs of bits, or FEC symbols, on the encoding side and the second interleaver 124 performs the reverse operation on the decoding side. A common form of interleaving is FEC symbol interleaving by an interleave factor (denoted as RSIL) when used in conjunction with the FEC encoder 118 (RSFE-CENC). An example of FEC symbol interleaving with RSIL=4 is shown in FIG. 2 for an encoded FEC codeword size of Nfec=544. It should be noted that the use of an interleaver causes additional latency through the communication system. The higher the interleave factor, the longer the additional latency. FIG. 2 illustrates an example of FEC symbol interleaving with an interleave factor of four for an encoded FEC codeword 200 according to at least one embodiment. The encoded FEC codeword 200 has a codeword size of 544. Each square represents one FEC symbol and each line pattern represents an adjacent FEC codeword after initial encoding.

Referring to FIG. 1A, as described above, there are FEC-related parameters 136 of the FEC system 104 that can be adjusted by the controller 102. Conventionally, FEC-related parameters 136 are static in a conventional FEC system, locking the conventional FEC system into a specific apriori chosen performance/power/latency tradeoff. The controller 102, as described in the various embodiments here, determines a post-FEC correlated performance metric indicative of an estimated post-FEC BER of the FEC system 104 in order to optimize post-FEC BER performances of the FEC system 104. The post-FEC correlated performance metric are metrics that correlate well with post-FEC BER performance. The controller 102 can dynamically adapt the FEC-related parameters 136 of the FEC system 104 to optimize the post-FEC BER performance. The FEC-related parameters 136 can be encoding/decoding layer parameters. In at least one embodiment, the FEC-related parameters 136 includes an interleave factor (RSIL).

In at least one embodiment, the transmitter circuit 112 and receiver circuit 114 have link parameters 140. The link parameters 140 can be SerDes parameters. In at least one embodiment, the link parameter is a phase noise parameter of a phase-locked loop (PLL) of the receiver circuit 114. In at least one embodiment, the controller 102 can dynamically adapt the link parameters 140 of the transmitter circuit 112 and receiver circuit 114 to optimize the post-FEC BER performance. It should be noted that conventionally, the link parameters 140 could be adjusted, but the link parameters 140 were adjusted based on some pre-FEC performance criteria. That is, a conventional controller would only measure the pre-FEC BER performance to optimize the SerDes parameters. As described above, there is no practical way to measure the post-FEC BER performance of the FEC system 104 directly for low post-FEC BERs where a system would typically operate. Thus, the embodiments described herein use one or more post-FEC correlated performance metrics indicative of an estimated post-FEC BER of the FEC system 104 in order to optimize the post-FEC BER performance of the FEC system 104. The post-FEC correlated performance metric are metrics that correlate with post-FEC BER performance. The embodiments described herein can modify link parameters 140 and/or FEC-related parameters 136 to optimize the post-FEC BER performance of the FEC system 104. The link parameters 140 can be adapted either directly on the SerDes hardware (e.g., transmitter circuit 112 and receiver circuit 114) or through use of an external controller (e.g., controller 102).

In at least one embodiment, the controller 102 can receive the FEC symbol error data 138 from the decoding layer 106b of the FEC system 104. The controller 102 can determine a post-FEC correlated performance metric using the FEC symbol error data 138. The controller 102 can adapt encoding/decoding layer parameters (FEC-related parameters 136) and/or SerDes parameters using the post-FEC correlated performance metric.

In at least one embodiment, the controller 102 can adapt (i) FEC-related parameters 136, such as the interleave factor to optimize post-FEC BER performance through the use of different post-FEC correlated performance metrics reflective of post-FEC BER performance. In at least one embodiment, the controller 102 can adapt (ii) link parameters 140, such as SerDes parameters, to optimize post-FEC BER performance through the use of different post-FEC correlated performance metrics reflective of post-FEC BER performance. The different post-FEC correlated performance metrics, also referred to as adaptation metrics, can be (i) based on a codeword histogram difference metric. The codeword histogram difference metric can be computed by comparing measured FEC codeword histogram to a desired target histogram. The different post-FEC correlated performance metrics can be (ii) based on FEC symbol error auto-correlation function (ACF).

In at least one embodiment, the controller 102, to optimize post-FEC performance, uses these metrics as indicators of post-FEC performance and then uses an algorithm to adjust the relevant FEC-related parameters 136 or link parameters 140 to meet an adaptation completion criterion for the selected metric. Table 1 shows the four possible combinations of which parameter to optimize and which adaptation metric to use.

TABLE 1

| | | Post-FEC adaptation metric | |
|---|---|---|---|
| | Four combinations of adaptation classes | | |
| | | Codeword histogram target deviation metric | FEC symbol error ACF based metric |
| Parameter to adapt | FEC-related parameters | 1 | 2 |
| | Link parameters (e.g., SerDes parameters) | 3 | 4 |

The following description includes details of the two adaptation metrics used to drive the adaptation of the FEC-related parameters 136, the link parameters 140, or both. Both metrics are constructed from raw FEC symbol error statistics from the decoding layer 106b of the FEC system 104, which in turn are comprised of raw bit error statistics from the decoding layer 106b. The controller 102 can receive the raw bit error statistics from the decoding layer 106b or can determine the bit error statistics based on information provided by the decoding layer 106b. It should be noted that in order for the decoding layer 106b to compute actual raw bit error information it must be cognizant of the transmitted bits to be able to make a comparison of the received bits with transmitted bits to be able to determine if a bit error occurred or not. As such, a bit error measurement can be made through the use of a training pattern, such as a pseudo-random bit sequence (PRBS) pattern known to both the transmitter circuit 108 and receiver circuit 110.

For example, let e(n) be the bit error stream at bit time n at the output of the RSILD 124 in the decoding layer 106b of the FEC system 104. Thus, when a bit is in error, the bit error stream will have e(n)=1, and when a bit is not in error, the bit error stream will have e(n)=0. A FEC symbol error stream fe(m) at FEC symbol times, m, can be constructed from the bit error stream e(n). For a given FEC, let L be the number of bits in a FEC symbol. The FEC symbol error is obtained from examining contiguous groups of L bits. If in any group of L bits, i.e., bits in a FEC symbol, corresponding with the mth group of such bits, any bit is in error, then the corresponding FEC symbol is declared to be in error, i.e., fe(m)=1. Only if none of the bits in the group of L bits is in error, then the FEC symbol is declared to not be in error, i.e., fe(m)=0. This can also be equivalently represented in the following equation:

$$fe(m) = \sum_{i=n-(L-1)}^{n} e(n),$$

where it should be noted that the sum represents an 'or' sum.

For example, for L=8 we would have:

$$fe(m) = e(n-7) \oplus e(n-6) \oplus$$
$$e(n-5) \oplus e(n-4) \oplus e(n-3) \oplus e(n-2) \oplus e(n-1) \oplus e(n)$$

where $\oplus$ represents the 'or' logical operator. Another exemplary value for L could be L=10.

The FEC symbol errors fe(m) can now be used to construct the post-FEC correlated performance metric, which are indicative of and well correlated to post-FEC BER performance.

Codeword Histogram (CWH) Deviation Metric

In at least one embodiment, the post-FEC correlated performance metric is a Codeword Histogram (CWH) Deviation Metric. From the FEC symbol error stream, the controller 102 can compile and generate a histogram or probability density function (PDF) statistics of the probability of occurrence of the number of FEC symbol errors in a given FEC codeword of size Nfec from a set of FEC symbol error measurements spanning Ncw codewords. A codeword histogram is essentially a mapping between the number of FEC symbol errors in a given a codeword of size Nfec and the probability of occurrence for that many FEC symbol errors. Table 2 shows in a tabular format an example of such a codeword histogram:

TABLE 2

| Example of Codeword Histogram | |
| --- | --- |
| Number of FEC Symbol Errors in Codeword of Length Nfec (i) | Probability of Occurrence hm(i, ber) |
| 0 | 0.889 |
| 1 | 1e−1 |
| 2 | 1e−2 |
| 3 | 1e−3 |
| 4 | 0 |
| 5 | 0 |
| And so on . . . | 0 |

A measurement-based histogram of the probability of occurrence can be denoted as $h_m(i, ber)$, where i represents the index of how many FEC symbol errors there are (first column of Table 2) and ber represents the pre-FEC BER at which the codeword measurements were taken.

A target codeword histogram metric, $h_t(i, ber)$, which is deemed achievable, can be computed apriori and stored in a look up table (LUT) as part of the controller 102.

Also let $h_{ml}(i, ber)$ and $h_{tl}(i, ber)$ represent the logarithm base10 of the corresponding measured and target codeword histograms, as follows:

$$h_{ml}(i, ber) = \log_{10}(h_m)$$
$$h_{tl}(i, ber) = \log_{10}(h_t)$$

A difference metric, diffmet(i), representing the absolute value of the deviation of the actual measured codeword histogram $h_m(i, ber)$ from the target at the ith value of the histogram can be computed as follows:

$$diffmet(i) = |h_{ml}(i, ber) - h_{tl}(i, ber)|,$$

where |x| refers to the absolute value of the quantity x.

The overall difference metric, diffmetcw, can then be computed as follows:

$$diffmetcw(ber) = \sum_{i=0}^{D} |h_{ml}(i, ber) - h_{tl}(i, ber)|,$$

where D represents the number of terms in the histogram over which the difference is computed.

The smaller the value of the difference metric, the better the post-FEC performance ber berpost is expected to be.

In addition, the controller 102 can compute and average the performance metric by averaging the difference metric across multiple measurements of the pre-FEC BER, ber. Such an averaged difference metric can be represented as follows:

$$diffmetcw_{av} = \frac{1}{J} \sum_{j=0}^{J} \sum_{i=0}^{D} |h_{ml}(i, ber_j) - h_{tl}(i, ber_j)|$$

Figure 1B:
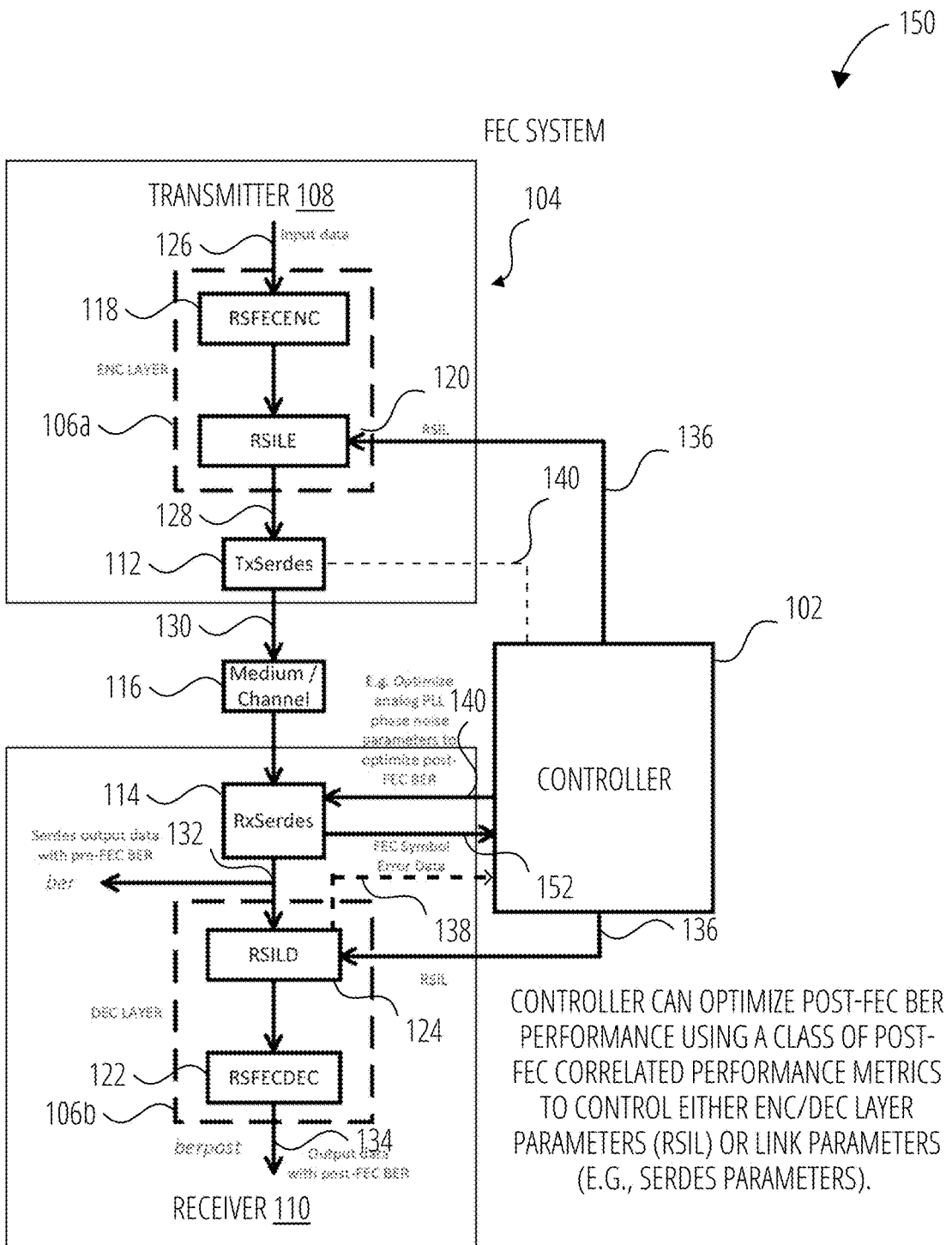
FIG. 1B is a block diagram of a communication system having a controller to optimize post-FEC BER performance of an FEC system using a post-FEC correlated performance metric according to at least one embodiment.

As described in the embodiments above, FEC symbol error data can be obtained for generating metrics, such as the post-FEC correlated performance metrics. As described with respect to FIG. 1A, the FEC symbol error data 138 can be output of the second interleaver 124 (labeled RSILD). This should cover all values of RSIL including RSIL=1 whether FEC parameters and/or SerDes parameters are optimized. In other embodiments, the FEC symbol error data 152 can be output of receiver circuit 114, as illustrated in FIG. 1B, and can be used only to optimize the SerDes parameters to improve post-FEC BER performance if such parameters adversely affect the metrics considered. It should be noted that, although the FEC symbol error data can be taken from the SerDes output (i.e., output of receiver circuit 114), it is still called an FEC symbol error because of the conversion of errors e(n) to FEC symbol errors (fe(n)) based on the FEC symbol size and as defined earlier by converting L error bits into one FEC symbol error. In other embodiments, both the FEC symbol error data 138 from the decoding layer (shown as dashed line in FIG. 1B) and FEC symbol error data 152 from the receiver circuit 114 could be used to optimize the post-FEC BER performance and the SerDes parameters. For example, the FEC symbol error data 152 from the receiver circuit 114 could be used to optimize the SerDes parameters for post-FEC BER performance and the FEC symbol error 138 from the decoding layer could be used to optimize the FEC parameters for post-FEC BER performance. Such optimization of multiple sets of parameters could be performed sequentially, in one embodiment, or jointly, in another embodiment. In one embodiment, a SerDes parameter could be optimized first using FEC symbol error data 138 and then a FEC parameter could be optimized using FEC symbol error data 152 in a sequential optimization scheme. Alternatively, the FEC parameter could be optimized before the SerDes parameter in a sequential optimization scheme. In another embodiment, all combinations of a SerDes parameter and a FEC symbol error parameter could be optimized together using FEC symbol error data 152 in a joint optimization scheme.

FIG. 1B is a block diagram of a communication system 150 having a controller 102 to optimize post-FEC BER performance of an FEC system 104 using a post-FEC correlated performance metric according to at least one embodiment. The communication system 150 is similar to communication system 100 as noted by similar reference numbers, except the receiver circuit 114 also outputs FEC symbol error data 152 to the controller 102.

Referring to FIG. 1B, as described above, there are link parameters 140 that can be adjusted by the controller 102. The link parameters 140 can be SerDes parameters. In at least one embodiment, the link parameter is a phase noise parameter of a phase-locked loop (PLL) of the receiver circuit 114. In at least one embodiment, the controller 102 can dynamically adapt the link parameters 140 of the transmitter circuit 112 and receiver circuit 114 to optimize the post-FEC BER performance of the FEC system 104 through the use of different post-FEC correlated performance metrics reflective of post-FEC BER performance. The different post-FEC correlated performance metrics, also referred to as adaptation metrics, can be (i) based on a codeword histogram difference metric. The codeword histogram difference metric can be computed by comparing measured FEC codeword histogram to a desired target histogram. The different post-FEC correlated performance metrics can be (ii) based on FEC symbol error auto-correlation function (ACF). The link parameters 140 can be adapted either directly on the SerDes hardware (e.g., transmitter circuit 112 and receiver circuit 114) or through use of an external controller (e.g., controller 102).

In at least one embodiment, the controller 102 can receive the FEC symbol error data 152 from the receiver circuit 114. The controller 102 can determine a post-FEC correlated performance metric using the FEC symbol error data 152. The controller 102 can adapt SerDes parameters using the post-FEC correlated performance metric. In at least one embodiment, the FEC symbol error data is only output from the receiver circuit. This mode can be useful if only SerDes related parameters are used to influence post-FEC behavior. In this case, examining the FEC symbol errors taken from the SerDes output is sufficient for adapting such SerDes related parameters. Examining the FEC symbol error data 152 at the SerDes output can be beneficial for standalone diagnostic or debugging of SerDes behaviors or parameters which influence post-FEC behavior. Examining the FEC symbol error data 152 at the SerDes output can be beneficial for optimizing SerDes parameters faster. Since the behavior of the SerDes is independent of FEC parameters, in some cases, the second interleaver 124 (RSILD) would add more latency or delay in adapting the parameters. If the improvement of its behavior or impact to the post-FEC BER performance can be seen at the output of the receiver circuit 114, then it will be better than seeing the improvement at the output of the second interleaver 124 (RSILD). By bypassing the second interleaver 124 (RSILD), the metrics can be examined with respect to the FEC symbol error data 152 at the receiver output.

In another embodiment, the controller 102 can receive the FEC symbol error data 138 from the decoding layer 106b of the FEC system 104 (illustrated as a dashed line in FIG. 1B) and the FEC symbol error data 152 from the receiver circuit 114. That is, the controller 102 can receive the FEC symbol error data 138 from the second interleaver 124 (labeled RSILD). In at least one embodiment, both the FEC-related parameters 136 and the link parameters 140 can be optimizes using the output of the receiver circuit 114 and the output of the second interleaver 124 (RSILD). As described herein, the FEC symbol error data 138, at the output of the second interleaver 124 (RSILD) could also be used to adapt the FEC-related parameters 136, in connection with the FEC symbol error data 152 and the link parameters 140. In these embodiments, two sets of mathematical descriptions could be defined: based on e_serdes(n) and fe_serdes(n) and say e_rsild(n), fe_rsild(n) where these represent the prior descriptions of e(n) and fe(n) but now distinctly taken at the SerDes output and the RSILD output, respectively. Thus, FEC symbol error data 138 would be denoted by fe_rsild(n) and FEC symbol error data 152 would be denoted by fe_serdes(n). It should be noted that any references to metric computations equations throughout this disclosure one could substitute fe(n) with fe_serdes(n) or fe_rsild(n) in the relevant metric computation equations.

There are various embodiments to adapt the FEC-related parameters 136 or link parameters 140 based on the codeword histogram metric. One such embodiment is shown in the flow chart of FIG. 3.

Figure 3:
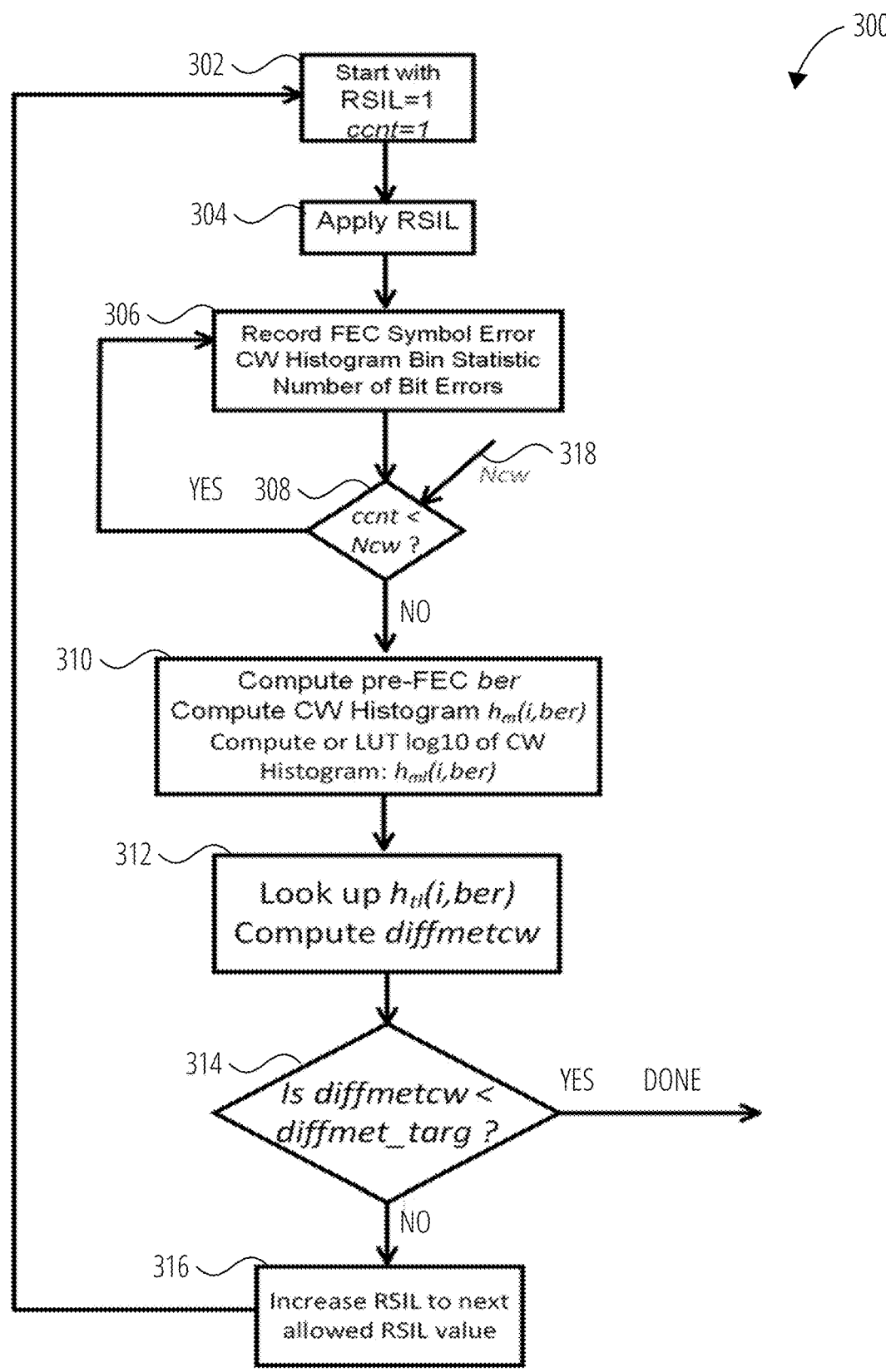
FIG. 3 is a flow diagram of a method of adapting FEC-related parameters based on a codeword histogram metric according to at least one embodiment.

FIG. 3 is a flow diagram of a method 300 of adapting the FEC-related parameters based on the codeword histogram metric according to at least one embodiment. The method 300 can be performed by processing logic comprising hardware, software, firmware, or any combination thereof. In at least one embodiment, the method 300 is performed by the controller 102 of FIG. 1A. In at least one embodiment, the method 300 is performed by the receiver 110 of FIG. 1A. In at least one embodiment, an integrated circuit performs the method 300. In another embodiment, a first device having an FEC system or FEC circuitry performs the method 300.

Referring to FIG. 3, the method 300 begins with the processing logic setting a minimum value of an interleave factor (e.g., RSIL=1) (block 302). In this example, the minimum value corresponds to no interleaving. The processing logic can successively increase the value of the interleave factor over a range of valid values (e.g., 1, 2, 4, 8) such that an optimal value for the interleave factor is determined. In this embodiment, the optimal value is determined as the one value when the corresponding difference metric, diffmetcw, or an averaged version of the difference metric, diffmetcw$_{av}$, falls below a programmed difference metric target, diffmet_targ. The measurements can be done such that each diffmetcw or diffmetcw$_{av}$ is based on measurements over a total number of FEC codewords, Ncw.

In particular, at block 302, a count value is initialized to one. At block 304, the processing logic applies the current value of the interleave factor. The first instance, the interleave factor is one, representing no interleaving. At block 306, the processing logic records FEC symbol error data. The processing logic can record the FEC symbol error codeword histogram bin statistics of the number of bit errors. At block 308, the processing logic determines whether the count value is less than the total number of FEC codewords 318, Ncw. If the count value is less than the total number of FEC codewords 318, the processing logic returns to continue recording the FEC symbol error data at block 306. Once the count value reaches the total number of FEC codewords 318, the processing logic computes the pre-FEC BER, the codeword histogram, compute the log$_{10}$ of the codeword histogram or use a LUT having the pre-computed values (block 310). At block 312, the processing logic computes the codeword histogram difference metric, diffmetcw. The processing logic can use a LUT to look up the target codeword histogram. At block 314, the processing logic determines whether the codeword histogram difference metric is less than a target threshold, diffmet_target. If the codeword histogram difference metric is less than the target threshold, the processing logic ends the method 300. However, if the codeword histogram difference metric is not less than the target threshold, the processing logic increments the interleave factor (RSIL) and returns to block 302. This method 300 continues until the codeword histogram difference metric is less than the target threshold at block 314.

In at least one embodiment, the processing logic can search for the interleave factor that gives a minimum codeword histogram difference metric. In another embodiment, the processing logic tracks how the codeword histogram difference metric is changing and stops and selects the interleave factor that results in the least change in the codeword histogram difference metric or the averaged version of the difference metric, diffmetcw$_{av}$ from the prior value of the metric at the prior interleave value.

In another embodiment, the target histogram h$_r$(i,ber) can depend on the specific transmitter/receiver architecture (e.g., SerDes architecture). It is possible to choose an "ideal" target corresponding to a given architecture. In addition, a global or common target metric can be a codeword histogram which would be obtained if all the FEC symbol errors at the output of the receiver circuit (e.g., SerDes output) were random. Such a histogram can be calculated analytically and apriori using binomial distribution equations and such a histogram can be stored in a LUT. This histogram can be the "random model" histogram, denoted as h$_r$(i,ber) or its log$_{10}$ version as h$_{rf}$(i,ber). As described above, values h$_{rf}$(i, ber) can be stored and accessed through a LUT as a function of i and the pre-FEC bit error rate, ber.

Figure 4B:
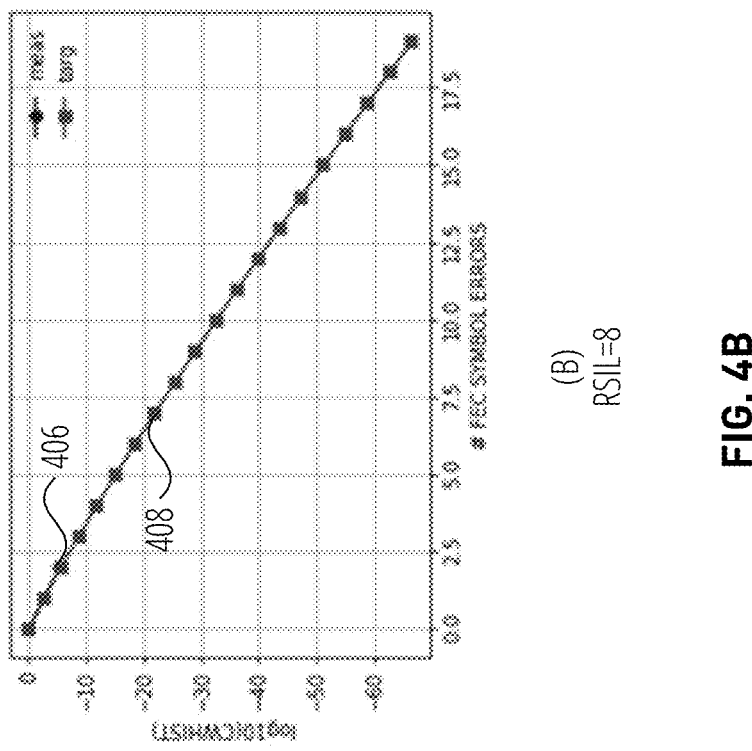
FIG. 4B illustrates an example of a measured FEC codeword histogram and a target FEC codeword histogram with an interleave factor of eight based on a random error model according to at least one embodiment.
Figure 4A:
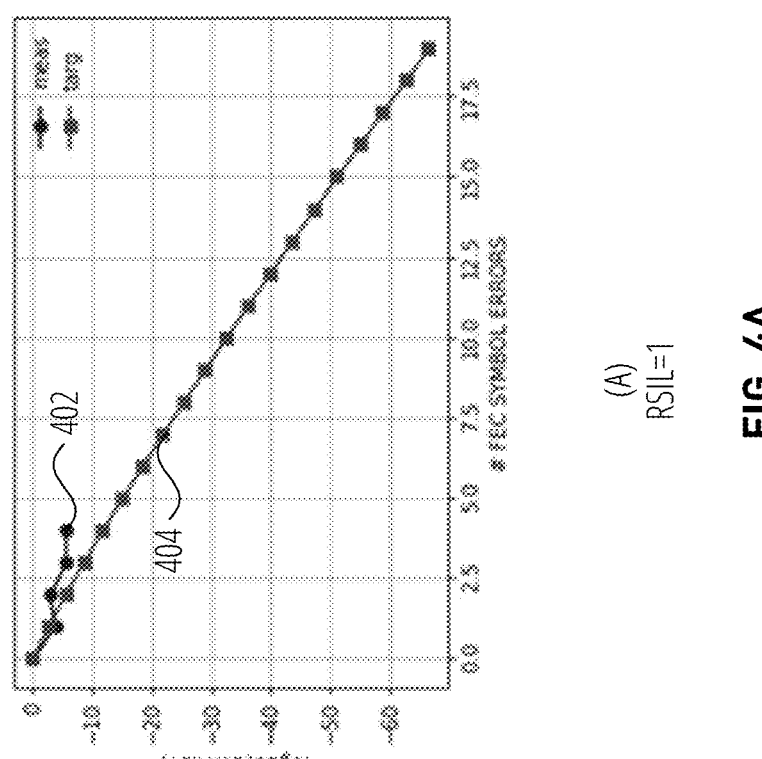
FIG. 4A illustrates an example of a measured FEC codeword histogram and a target FEC codeword histogram without interleaving based on a random error model according to at least one embodiment.

FIG. 4A illustrates an example of a measured FEC codeword histogram 402 and a target FEC codeword histogram 404 without interleaving (e.g., RSIL=1) based on a random error model according to at least one embodiment.

FIG. 4B illustrates an example of a measured FEC codeword histogram 406 and a target FEC codeword histogram 408 with an interleave factor of eight based on a random error model according to at least one embodiment. As illustrated in FIG. 4A and FIG. 4B, the plots are for different interleave factors (RSIL values) of one and eight, respectively. These curves are shown at a given BER, which is the same across all cases.

Figure 5:
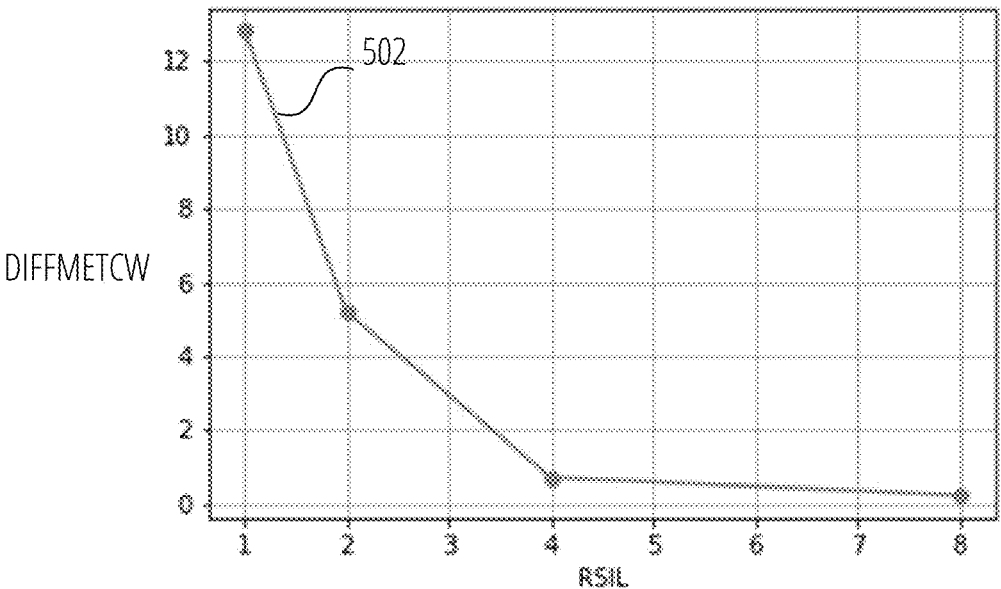
FIG. 5 is a graph showing a codeword histogram difference metric as a function of interleave factor according to at least one embodiment.

FIG. 5 is a graph showing a codeword histogram difference metric 502, diffmetcw, as a function of interleave factor according to at least one embodiment. This example is for a particular scenario of a SerDes circuit and channel and uses h$_{rf}$(i,ber) as the target FEC codeword histogram 408. As illustrated in FIG. 5, the observed measured codeword histogram difference metric 502 improves by increasing the interleave factor (RSIL).

Auto-Correlation Function (ACF) Metric

Another post-FEC correlated adaptation metric can be auto-correlation function (ACF) metric used to adapt FEC-related parameters and/or link parameters. Here, a well known ACF can be computed, Rf(j) of the FEC symbol error stream fe(m) according to an ACF definition as follows.

$$Rf(j) = \frac{1}{Nacf} \sum_{j=0}^{Nacf} fe(m)fe(m+j)$$

A normalized version of the ACF Rfn(j) can be computed as follows:

$$Rfn(j) = \frac{1}{Rf(0)} Rf(j)$$

This function can be expressed in the log domain as follows:

$$Rfnl(j) = 20 \log_{10}(Rfn(j))$$

It should be noted that the number of FEC symbol errors Nacf over which Rf(j) is computed should be chosen large enough such that the number of non-zero FEC symbol errors in fe(m) is sufficiently large. In practice, Nacf may have to be allowed to vary until a criterion is satisfied such as the number of non-zero FEC symbol errors is a programmed value denoted by a span, S. For example, the span, S, could be 100 or 1000 or larger. The larger the value of S, the more accurate the Rf(j) calculation is, but at the expense of computation complexity, storage requirements, memory requirements on the collection of fe(m) symbols.

From the ACF function Rfnl(j), a criterion, of which there are multiple possibilities, can be used to compute an ACF metric which can be compared to a desired target ACF metric value. In general, it is better for post-FEC performance for terms Rfnl(j), j unequal to 0 to be small as possible. Various computations can be used for the ACF metric to determine whether the ACF metric is below a desired target ACF metric value (i.e., Rfmet<Rfmet_targ). There are three examples below of such metric options that vary in complexity:

$$Rfmet = |Rfnl(1)|(\text{a single term metric})$$

$$Rfmet = |Rfnl(1)| + |Rfnl(2)|(\text{two term metric})$$

$$Rfmet = \sum_{j=1}^{Nacfterms} |Rfnl(j)|(\text{multi-term metric})$$

The last option is a multi-term metric. Another option is a weighted average metric which gives more or less weights, wt(j), to specific Rfnl terms, as expressed below:

$$Rfmet = \sum_{j=1}^{Nacfterms} \text{wt}(j)|Rfnl(j)|(\text{weighted multi-term metric})$$

An example of an adaptation of an encoding/decoding parameter (e.g., RSIL) using an ACF metric is described below with respect to FIG. 6. In this example, an interleave factor is set to 1 and increased until the ACF metric falls below a certain desired target metric.

Figure 6:
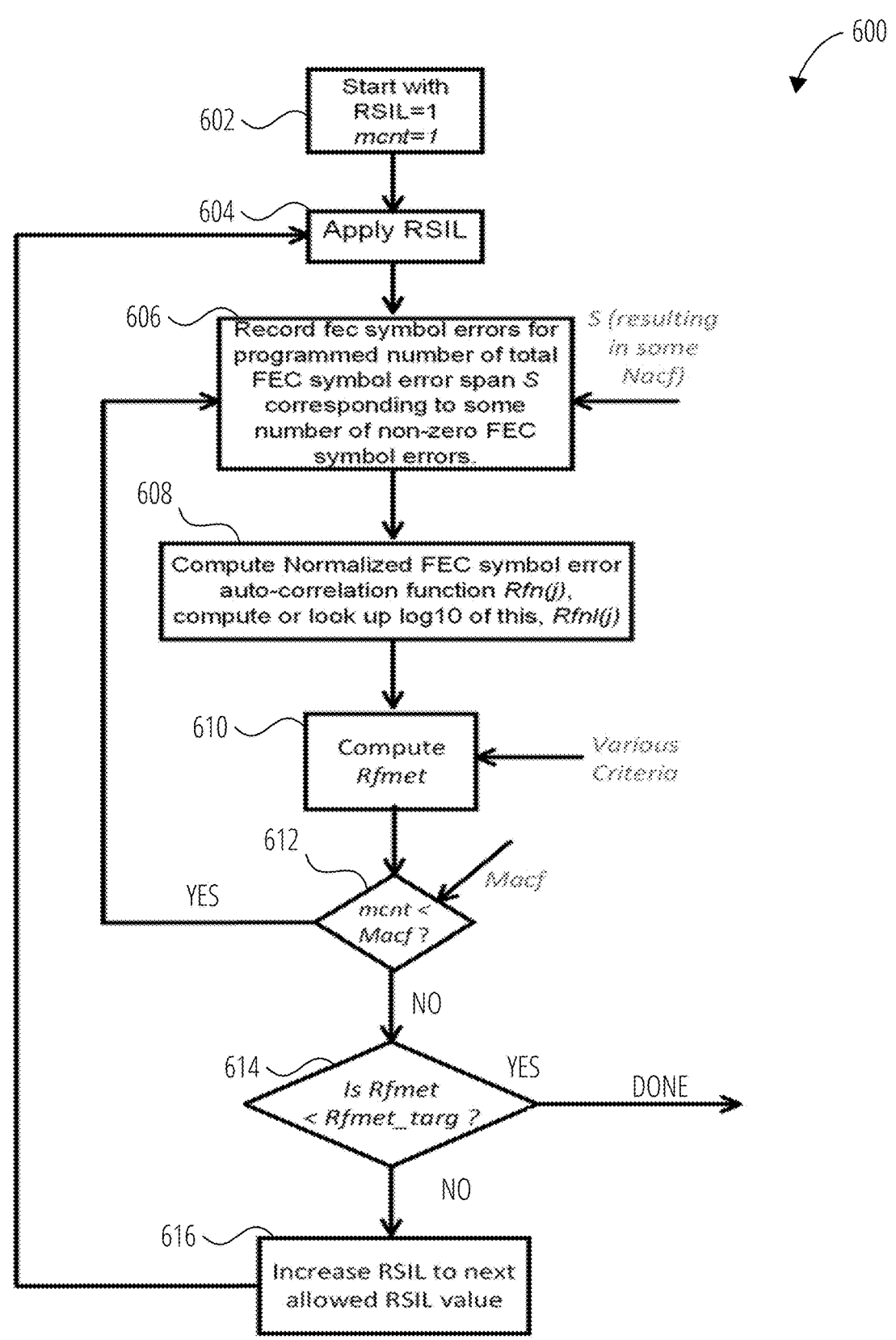
FIG. 6 is a flow diagram of a method of adapting an FEC-related parameter based on an auto-correlation function (ACF) metric according to at least one embodiment.

FIG. 6 is a flow diagram of a method of adapting an FEC-related parameter based on an auto-correlation function (ACF) metric according to at least one embodiment. The method 600 can be performed by processing logic comprising hardware, software, firmware, or any combination thereof. In at least one embodiment, the method 600 is performed by the controller 102 of FIG. 1A. In at least one embodiment, the method 600 is performed by the receiver 110 of FIG. 1A. In at least one embodiment, an integrated circuit performs the method 600. In another embodiment, a first device having an FEC system or FEC circuitry performs the method 600.

Referring to FIG. 6, the method 600 begins with the processing logic setting a minimum value of an interleave factor (e.g., RSIL=1) (block 602). In this example, the minimum value corresponds to no interleaving. The processing logic can successively increase the value of the interleave factor over a range of valid values (e.g., 1, 2, 4, 8) such that an optimal value for the interleave factor is determined. In this embodiment, the optimal value is determined as the one value when the corresponding ACF metric, Refmet, falls below a programmed difference metric target, Rfmet_targ. The measurements can be done such that each Refmet is based on measurements over a total number of FEC codewords, Macf.

In particular, at block 602, a count value (ment) is initialized to one. At block 604, the processing logic applies the current value of the interleave factor. The first instance, the interleave factor is one, representing no interleaving. At block 606, the processing logic records FEC symbol error data. The processing logic can record the FEC symbol errors for a programmed number of total FEC symbol errors span, S, corresponding to some number of non-zero FEC symbol errors (Nacf). At block 608, the processing logic computes an normalized FEC symbol error ACF, Rfn(j), and computer or look up the log$_{10}$ of this, Rfnl(j). At block 610, the processing logic computes the ACF metric, Rfmet, based on various criteria. At block 612, the processing logic determines whether the count value is less than the total number of FEC codewords, Macf. If the count value is less than the total number of FEC codewords, Macf, the processing logic returns to continue recording the FEC symbol error data at block 606. Once the count value reaches the total number of FEC codewords, Macf, the processing logic determines whether the ACF metric, Rfmet, is less than a target threshold, Rfmet_targ (block 614). If the ACF metric is less than the target threshold, the processing logic ends the method 600. However, if the ACF metric is not less than the target threshold, the processing logic increments the interleave factor (RSIL) and returns to block 604. This method 600 continues until the ACF metric is less than the target threshold at block 614.

Figures 7A, 7B:
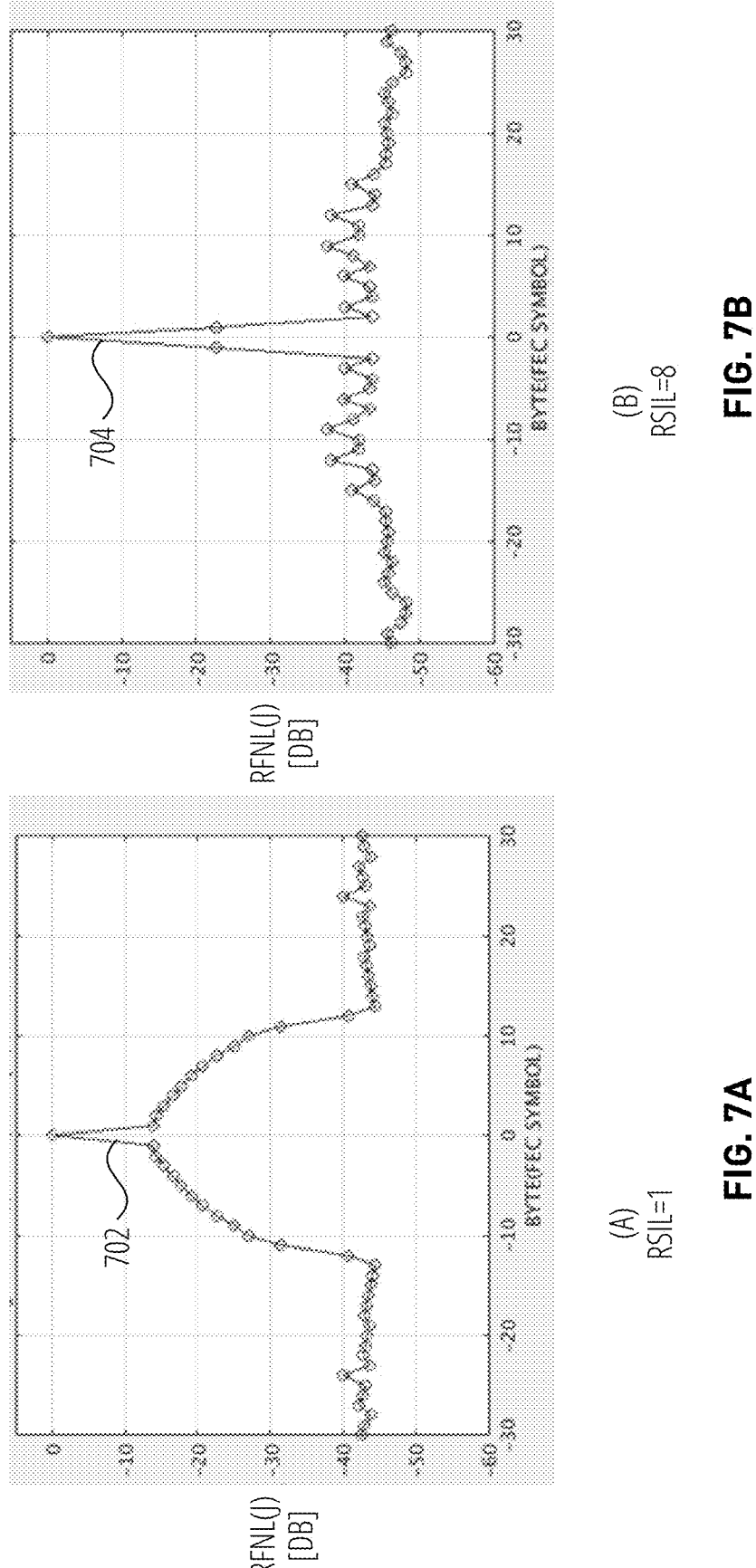
FIG. 7A illustrates an example of a measured ACF metric without interleaving according to at least one embodiment.
FIG. 7B illustrates an example of a measured ACF metric with an interleave factor of eight according to at least one embodiment.

FIG. 7A illustrates an example of a measured ACF metric 702 without interleaving (e.g., RSIL=1) based on a random error model according to at least one embodiment.

FIG. 7B illustrates an example of a measured ACF metric 704 with an interleave factor of eight (e.g., RSIL=8) according to at least one embodiment.

As illustrated in FIG. 7A and FIG. 7B, the ACF Rfnl(j) with no interleaving corresponds with a particularly poor ACF Rfnl(j) and the ACF Rfnl(j) is improved after employing an interleave factor of eight (RSIL=8).

Link Parameter Adaptation Using the Codeword Histogram Metric

Figure 8:
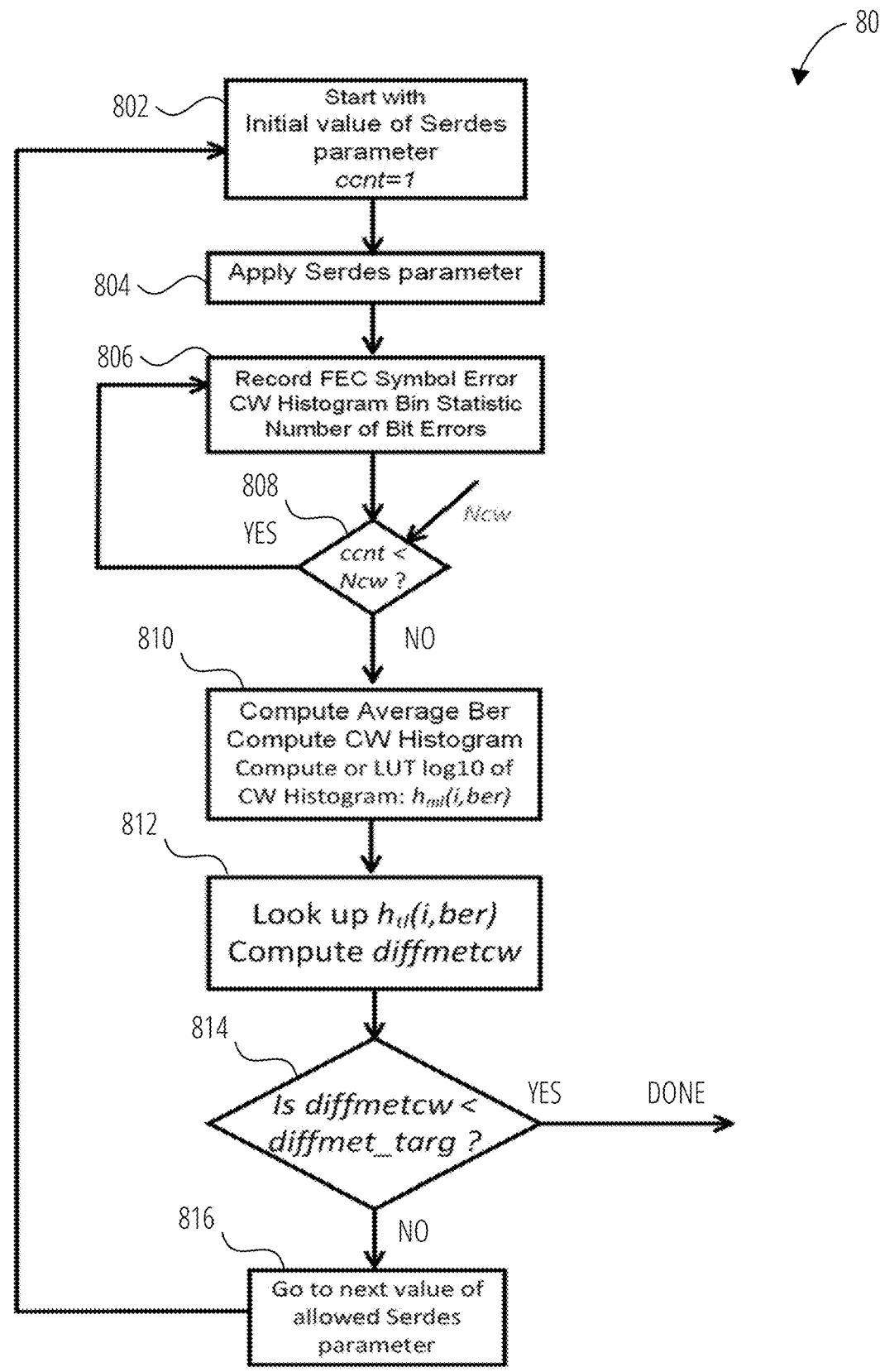
FIG. 8 is a flow diagram of a method of adapting a link parameter based on a codeword histogram metric according to at least one embodiment.

FIG. 8 is a flow diagram of a method 800 of adapting a link parameter based on a codeword histogram metric according to at least one embodiment. The method 800 can be performed by processing logic comprising hardware, software, firmware, or any combination thereof. In at least one embodiment, the method 800 is performed by the controller 102 of FIG. 1A. In at least one embodiment, the method 800 is performed by the receiver 110 of FIG. 1A. In at least one embodiment, an integrated circuit performs the method 800. In another embodiment, a first device having an FEC system or FEC circuitry performs the method 800.

Referring to FIG. 8, the method 800 begins with the processing logic setting an initial value of a link parameter (e.g., SerDes parameter) and a count value to one (block 802). The initial value may be a phase noise parameter of a PLL of a SerDes circuit. The processing logic can successively increase the initial value over a range of valid values such that an optimal value for the link parameter is determined. In this embodiment, the optimal value is determined as the one value when the corresponding difference metric, diffmetcw, or an averaged version of the difference metric, diffmetcw$_{av}$, falls below a programmed difference metric target, diffmet_targ. The measurements can be done such that each diffmetcw or diffmetcw$_{av}$ is based on measurements over a total number of FEC codewords, Ncw.

At block 804, the processing logic applies the current value of the link parameter. The first instance, the link parameter is the initial value. At block 806, the processing logic records FEC symbol error data. The processing logic can record the FEC symbol error codeword histogram bin statistics of the number of bit errors. At block 808, the processing logic determines whether the count value is less than the total number of FEC codewords, Ncw. If the count value is less than the total number of FEC codewords, the processing logic returns to continue recording the FEC symbol error data at block 806. Once the count value reaches the total number of FEC codewords, the processing logic computes the pre-FEC BER, the codeword histogram, compute the log 10 of the codeword histogram or use a LUT having the pre-computed values (block 810). At block 812, the processing logic computes the codeword histogram difference metric, diffmetcw. The processing logic can use a LUT to look up the target codeword histogram. At block 814, the processing logic determines whether the codeword histogram difference metric is less than a target threshold, diffmet_target. If the codeword histogram difference metric is less than the target threshold, the processing logic ends the method 800. However, if the codeword histogram difference metric is not less than the target threshold, the processing logic increments the initial value of the link parameter and returns to block 802. This method 800 continues until the codeword histogram difference metric is less than the target threshold at block 814.

In at least one embodiment, the processing logic can search for the interleave factor that gives a minimum codeword histogram difference metric. In another embodiment, the processing logic tracks how the codeword histogram difference metric is changing and stops and selects the interleave factor that results in the least change in the codeword histogram difference metric or the averaged version of the difference metric, diffmetcw$_{av}$ from the prior value of the metric at the prior interleave value.

In another embodiment, the target histogram h$_t$(i,ber) can depend on the specific transmitter/receiver architecture (e.g., SerDes architecture). It is possible to choose an "ideal" target corresponding to a given architecture. In addition, a global or common target metric can be a codeword histogram which would be obtained if all the FEC symbol errors at the output of the receiver circuit (e.g., SerDes output) were random. Such a histogram can be calculated analytically and apriori using binomial distribution equations and such a histogram can be stored in a look up table (LUT). This histogram can be the "random model" histogram, denoted as h$_r$(i,ber) or its log 10 version as h$_{rl}$(i,ber). As described above, values h$_{rl}$(i,ber) can be stored and accessed through a LUT as a function of i and the pre-FEC bit error rate ber. For a SerDes which equalizes its received signal to a partial response equalization target, one can also consider a histogram target, hprl(i,ber), which would be specific for that partial response, and which could also be precomputed and stored in a LUT. Such a target histogram can be computed using various techniques. Such a target could be particularly useful for adapting the SerDes parameters for improved post-FEC performance. Referring to FIG. 1A, in one embodiment, the SerDes parameters could be adapted by comparing a measured histogram based on FEC symbol errors 152 against a first target, such as the partial response equalization target, while FEC parameters could be adapted by comparing a measured histogram based on FEC symbol errors 138 against a second target based on the random model histogram. Such SerDes and FEC parameter optimization based on different targets could be performed sequentially, in one embodiment, or jointly, in another embodiment.

In the example of FIG. 8, there is a framework for adapting the codeword histogram metric to adapt an internal link parameter, such as a SerDes internal parameter. An example of a potential SerDes internal parameter could be an analog PLL control parameter, such as a DC value of the phase noise frequency spectrum characteristics. If the SerDes circuit allows multiple control values of this DC value, which allows a performance/power tradeoff, one could use the adaptation algorithm to find the DC value which results in an optimum power/performance tradeoff, for example.

As described herein, other encoding/decoding layer parameters can be controlled if they affect post-FEC BER performance. This could be indicated in either the codeword histogram difference metric or the ACF metric. An adaptation criterion combining the codeword histogram difference metric and the ACF metric, or a weighted combination of the two.

In at least one embodiment, an enhanced version of the metric could be used by averaging over multiple independent sets of FEC symbols as follows:

$$Rfav(j) = \frac{1}{Macf}\sum_{m=1}^{Macf} Rf_m(j),$$

where Rfm(j) represents the ACF computed over the mth independent data set. The ACF Rfav(j) would subsequently be used as the final ACF used for the metric choices.

In another embodiment, instead of averaging across independent sets of FEC symbols and depending on the embodiment of the Rfmet being considered, one can consider other operations across the independent data sets besides averaging. For example, if Rfmet=|Rf(1)| then one can consider a 'worst' case metric taking the max of |Rfm(1)| where Rfm(1) represents the 1$^{st}$ ACF term from the mth independent ACF measurement. This is represented in equation format as follows:

$$Rfmetmx = \max\left(|Rf_1(1)|, |Rf_2(1)|, \dots |Rf_{Macf}(1)|\right)$$

Although the examples shown are with an encoding layer containing an RSFEC encoder/decoder, the algorithms can be used in a system employing 'concatenated coding' with an additional code or codes which can be inserted between the RSFEC and the SerDes or prior to the current RSFEC in the encoding layer and after the RSFEC in the decoding layer. One such concatenated system is shown in FIG. 9A.

Figure 9A:
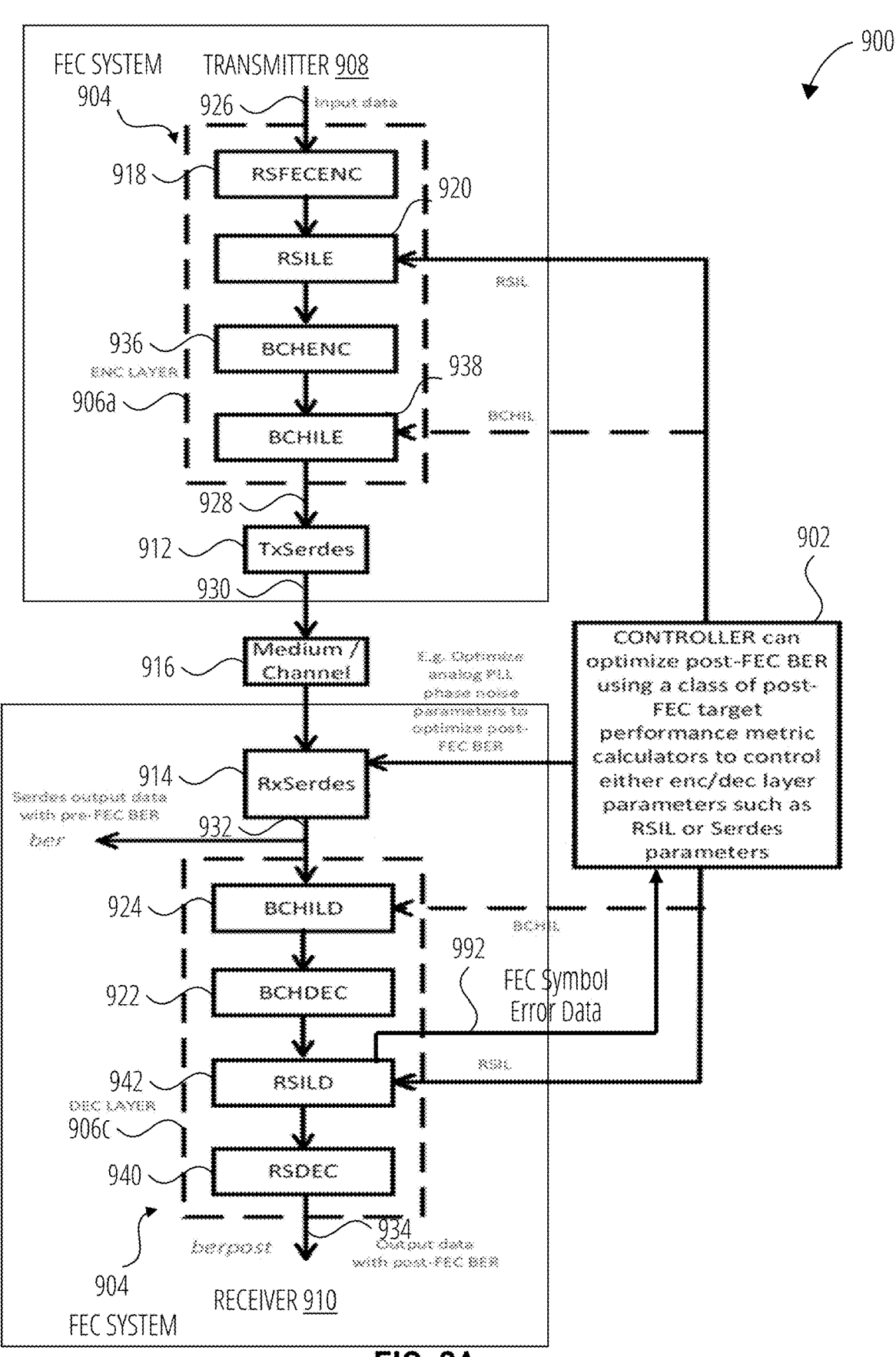
FIG. 9A is a block diagram of a communication system having a controller to optimize post-FEC BER performance of an FEC system with a concatenated code system using a post-FEC correlated performance metric according to at least one embodiment.

FIG. 9A is a block diagram of a communication system 900 having a controller 902 to optimize post-FEC BER performance of an FEC system with a concatenated code system using a post-FEC correlated performance metric according to at least one embodiment. The communication system 900 includes a transmitter 908 (also referred to as a transmitter device or transmitting device), a receiver 910 (also referred to as a receiver device or receiving device), and the controller 902 operatively coupled to the receiver circuit 914, the transmitter circuit 912, and the FEC system 904. In this embodiment, the FEC system 904 is a concatenated code system with a RS code and RS interleaving (RSILE, RSILD) and a BCH code and BCH interleaving (BCHILE, BCHILD) as part of a concatenated code. In other embodiments, other error correcting codes can be used, such as Hamming codes, extended Hamming codes, Golay codes, parity codes, multidimensional parity codes, triple modular redundancy codes, Nordstrom-Robinson codes, CRC codes, or the like.

In at least one embodiment, the transmitter 908 is part of a first transceiver that also includes a receiver (not illustrated in FIG. 9A) and the receiver 910 is part of a second transceiver that also includes a transmitter (not illustrated in FIG. 9A). The transmitter 908 includes a transmitter circuit 912, such as a SerDes TX circuit. The transmitter circuit 912 sends signals over a communication channel 916 (also referred to as "channel," "communication medium," or "transmission medium." The receiver 910 includes a receiver circuit 914, such as a SerDes RX circuit. The receiver circuit 914 receives signals over the communication channel 916.

In at least one embodiment, the FEC system 904 includes an encoding layer 906a at the transmitter 908 and a decoding layer 906c at the receiver 910. The encoding layer 906a can encode input data 926 (e.g., user or input bits) into concatenated FEC codewords 928. In at least one embodiment, the FEC system 904 uses a RS engine and a BCH engine. In particular, the FEC system 904 includes a first FEC encoder 918 and a second FEC encoder 936. The first FEC encoder 918 can be an RS FEC encoder (RSFECENC) and the second FEC encoder 936 can be an BCH FEC encoder (BCHENC). Other encoding operations may be performed in the encoding layer 906a (and decoding operations in the decoding layer 906c). In other embodiments, other encoding operations can be performed in the transmitter circuit 912 and receiver circuit 914, such as precoding, Gray coding, run length encoding, or the like. During the encoding process, the first FEC encoder 918 (e.g., RSFECENC) usually processes groups of bits called FEC symbols, which are typically groups of say 8 or 10 bits at a time. The second FEC encoder 936 (e.g., BCHENC) can process the FEC symbols from the first FEC encoder 918. The second FEC encoder 936 outputs concatenated FEC codewords 928. After the encoding process, the transmitter circuit 912 (e.g., SerDes TX circuit sends the equivalent binary bits in a bit stream 930 as an analog waveform through communication channel 916. The receiver circuit 914 (e.g., SerDes RX circuit) processes the analog signal, performing operations, such as equalization/detection, clock/data recovery, and produces a bit stream 932, which in the absence of impairments or noise in the communication channel 916 would match the concatenated FEC codewords 928 of transmitted bit stream 930.

It should be noted that the bits of the bit stream 932, at the output of the receiver circuit 914 (e.g., SerDes RX circuit), are produced with a finite pre-FEC BER. This finite pre-FEC BER can be high. These pre-FEC bits at the output of the receiver circuit 914 (e.g., SerDes RX circuit) are typically grouped again as FEC symbols for the decoding layer 906c. During the decoding process, a first FEC decoder 922 and a second FEC decoder 940 decode the RX SerDes output to produce output data 934. The underlying bits of the output data 934 have significantly better (i.e., lower) post-FEC BER than the pre-FEC BER observed at the SerDes RX output. In at least one embodiment, the first FEC decoder 922 is a BCH decoder (e.g., BCHDEC) and the second FEC decoder 940 is a RS decoder (e.g., RSFECDEC). Other encoding and decoding FEC algorithms can be used for the encoding layer 906a and decoding layer 906c. It should be noted that the terms encoding/decoding layers are generic terms, but the functionality of these layers can be found in systems that use other terminologies, such as physical coding sub-layer (PCS), or the like. Other standards bodies may have other names for where such functionality resides.

In addition, interleaving may be applied in conjunction with the FEC system 904. In at least one embodiment, the encoding layer 906a can include the first FEC encoder 918 and a first interleaver 920, and the second FEC encoder 936 and a second interleaver 938. In at least one embodiment, the decoding layer 906c can include the first FEC decoder 922 and a third interleaver 924, and a second FEC decoder 940 and a fourth interleaver 942. The interleaving for the first FEC encoder 918 (RSFEC) is denoted as RSILE for the first interleaver 920 in the encoding layer 906a and RSILD for the fourth interleaver 942 in the decoding layer 906c. The interleaving for the second FEC encoder 936 (BCHFEC) is denoted as BCHILE for the second interleaver 938 in the encoding layer 906a and BCHIL for the third interleaver 924 in the decoding layer 906c. The interleaving may be of various types either operating on bits, pairs of bits, or FEC symbols. Depending on the interleaver type, the first interleaver 920 and second interleaver 938 reorder groups of bits, pairs of bits, or FEC symbols, on the encoding side and the third interleaver 924 and fourth interleaver 942 perform the reverse operations on the decoding side. In this embodiment, there is a first interleave factor (RSIL) and a second interleave factor (BCHIL) used in connection with the different encoders and decoders. In other embodiments, other FEC-related parameters of the two FEC engines can be adjusted.

In at least one embodiment, other forms of distribution of outputs in the encoding layer 906a and decoding layer 906c can be used. For example, a data stream could be interleaved across multiple FEC engines and multiple physical lanes-instead of time interleaving using one FEC engine and one physical lane or time interleaving using two FEC engines and one physical lane as shown in FIG. 1A and FIG. 9A, respectively. As such, the metrics for post-FEC performance herein could be used to dynamically control the number of FEC engines used or parameters related to the subsequent interleaving or number of physical lanes over which the data is distributed.

Codeword Histogram Deviation Metric without a Training Pattern Using Approximate Histogram Measurements The baseline codeword histogram deviation metric is obtained from a measured codeword histogram which in turn is obtained from measured FEC symbol errors fe(m) and the underlying bit errors e(n) as described previously. To obtain the underlying true bit errors e(n) assumes an ability to compare the received detected bits with the corresponding transmitted bits. This is typically accomplished in a training mode where the transmitter is transmitting a pattern, such as a PRBS pattern, known to both the transmitter and receiver.

However, it is also highly desirable to be able to compute a deviation metric without having to transmit a training pattern, i.e., be able to compute a codeword deviation metric when the transmitter is transmitting live user data not known to the receiver.

Towards this goal, it is possible to directly obtain an approximate measurement of the FEC symbol error statistics by using information from the FEC decoder itself. Upon receiving a codeword from the SerDes, the FEC decoder will take one of 3 possible actions (i) correct some number of FEC symbol errors in that codeword at the correct error locations in the received codeword (ii) not make any correction attempt when there were no errors in the received codeword (iii) not make any correction attempt when there were errors in the received codeword (iv) perform a miscorrection i.e., it is unable to correct all the actual FEC symbol errors in the received codeword and may attempt a to correct one or more FEC symbols not corresponding with the actual FEC symbol error locations in the codeword. The third and fourth scenarios are obviously undesirable with the fourth scenario actually being harmful. However, FEC theory suggests that the probability of the last two scenarios occurring are significantly lower than that of the first two scenarios and thus negligible for many FEC codes. The higher the correction capability of the FEC code, the lower are the probability for the undesirable scenarios. Thus, simply by examining the number of FEC symbol error corrections per codeword, fdec_correw(r) for the rth codeword, attempted by the FEC decoder and considering them to be the actual the number of FEC symbol errors in the received codeword, the controller can generate an approximate measured histogram which for the sake of technical accuracy is denoted as $h_{ma}(i,ber)$ to distinguish it from $h_m(i,ber)$ which is the measured histogram derived from the true FEC symbol error stream which would have been obtained with a training pattern. Note that in scenarios (i) and (ii) fdec_correw will correspond to the true number of FEC symbol errors per codeword whereas in scenarios (iii) and (iv), it will not. However, as noted earlier, the probability of scenarios (iii) and (iv) is typically very compared with the probability of scenarios (i) or (ii).

Once we obtain the approximate histogram, $h_{ma}(i,ber)$, the codeword deviation metric is computed as done previously using $h_{ma}(i,ber)$ instead of $h_m(i,ber)$. The corresponding equations are similar to before and are listed as follows after making this substitution of $h_{ma}(i,ber)$ instead of $h_m(i,ber)$:

$$h_{mal}(i, ber) = \log_{10}(h_{ma})$$

$$diffmeta(i) = |h_{mal}(i, ber) - h_{tl}(i, ber)|$$

$$diffmetcwa(ber) = \sum_{i=0}^{D} |h_{mal}(i, ber) - h_{tl}(i, ber)|$$

$$diffmetcwa_{av}(ber) = \frac{1}{J} \sum_{i=0}^{J} \sum_{i=0}^{D} |h_{mal}(i, ber) - h_{tl}(i, ber)|$$

Figure 9B:
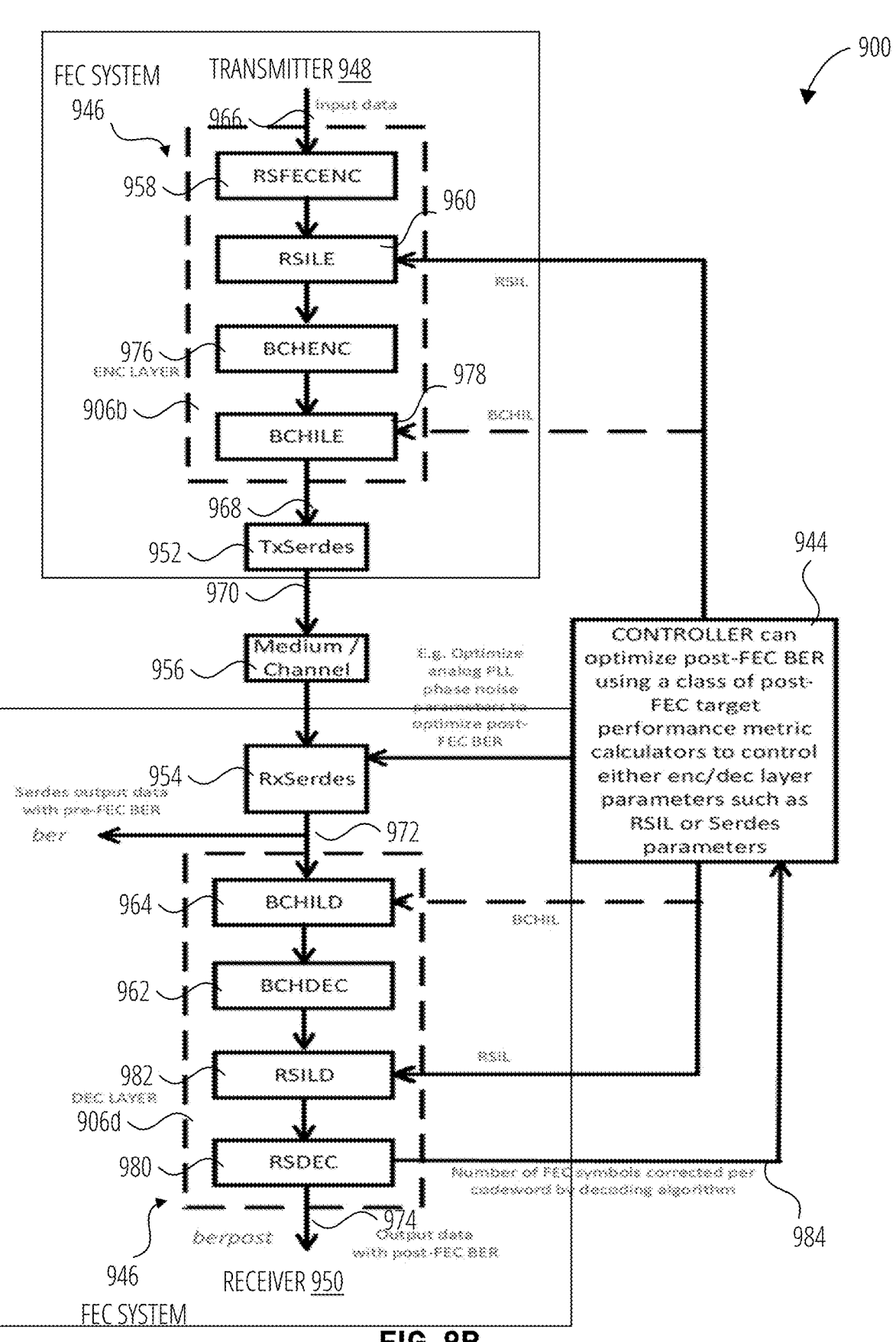
FIG. 9B is a block diagram of a communication system having a controller to optimize post-FEC BER performance of an FEC system with a concatenated code system using a post-FEC correlated performance metric according to at least one embodiment.

An example embodiment of the concatenated FEC scenario where information from the FEC decoder is passed to the controller to compute the codeword histogram deviation metric is illustrated and described with respect to FIG. 9B.

FIG. 9B is a block diagram of a communication system 900 having a controller 902 to optimize post-FEC BER performance of an FEC system with a concatenated code system using a post-FEC correlated performance metric according to at least one embodiment. The controller 902 in FIG. 9B receives a number of corrected FEC symbols 984 from the second FEC decoder 980, instead of the FEC symbol error data from the receiver circuit 954. The number of corrected FEC symbols 984 represents the number of FEC symbols corrected per codeword by the decoding algorithm. As described above, the number of corrected FEC symbols 984 is an approximate measurement of the FEC symbol error statistics. The number of corrected FEC symbols 984 can be used to generate a measured approximate FEC codeword histogram to be compared with a target histogram. That is, the post-FEC correlated performance metric can be based on a codeword histogram difference metric derived from a comparison of the measured approximate FEC codeword histogram and the target histogram. The controller can adjust, based on the post-FEC correlated performance metric, at least one of a FEC parameter of the FEC circuit or a link parameter of the receiver circuit, as described herein. In another embodiment, the controller 902 can determine, using the number of corrected FEC symbols 984, a post-FEC correlated performance metric indicative of an estimated post-FEC BER of the FEC circuit in other manners. In other embodiments, the controller 902 can receive the FEC symbol error data from the receiver circuit 954, as well as the number of corrected FEC symbols 984 from the second FEC decoder 980.

Figure 9C:
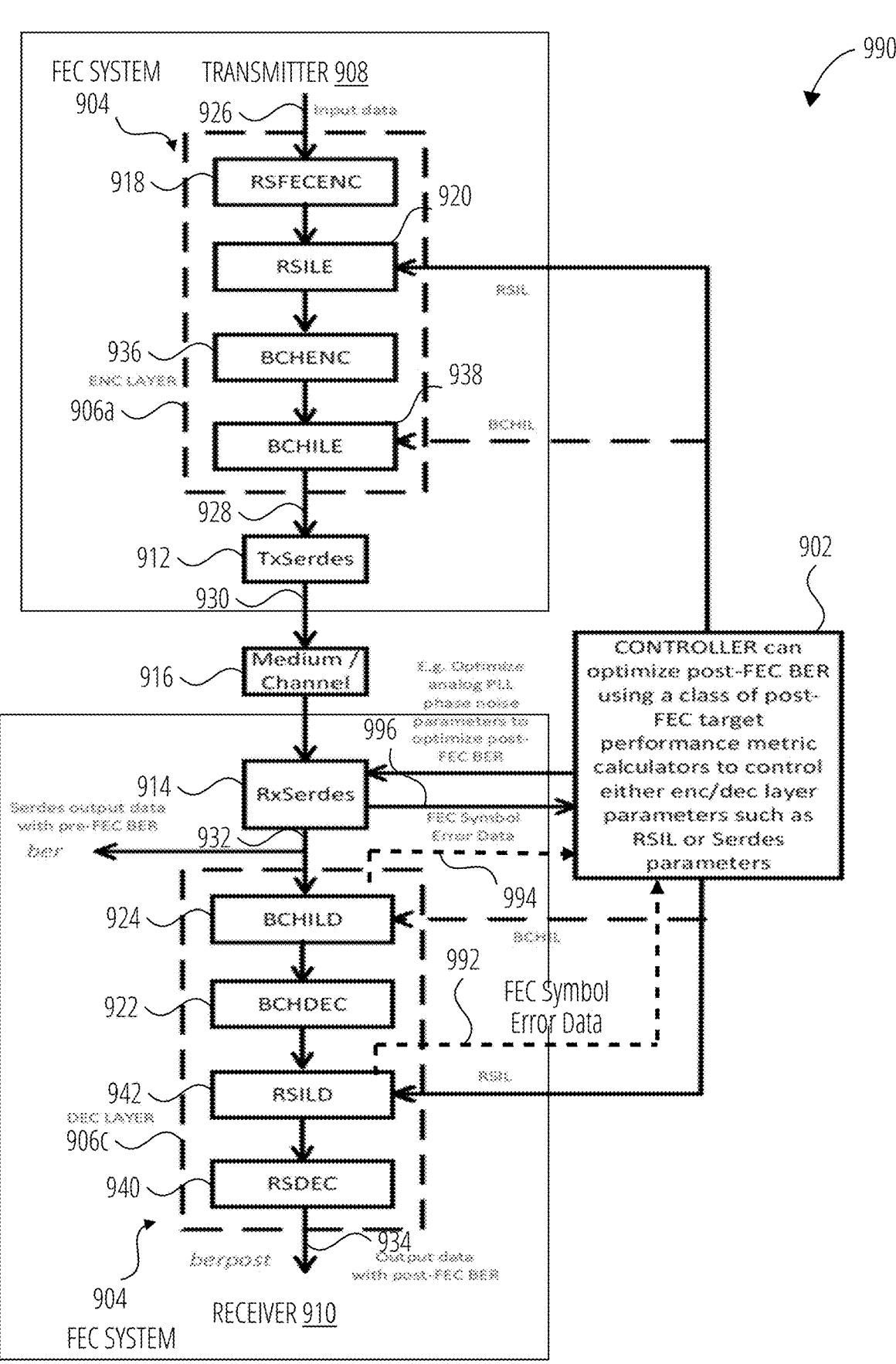
FIG. 9C is a block diagram of a communication system having a controller to optimize post-FEC BER performance of an FEC system with a concatenated code system using a post-FEC correlated performance metric according to at least one embodiment.

FIG. 9C is a block diagram of a communication system 990 having a controller 902 to optimize post-FEC BER performance of an FEC system with a concatenated code system using a post-FEC correlated performance metric according to at least one embodiment. The communication system 990 is similar to the communication system 900 except the controller 902 can receive FEC symbol error data 992 from the fourth interleaver 942 (RSILD), FEC symbol error data 994 from third interleaver 924 (BCHILD) and/or FEC symbol error data 996 from receiver circuit 914 (SerDes output).

Referring back to FIG. 9A, as described above, there are FEC-related parameters of the FEC system 904 that can be adjusted by the controller 902. The controller 902, as described in the various embodiments here, determines a post-FEC correlated performance metric indicative of an estimated post-FEC BER of the FEC system 904 in order to optimize post-FEC BER performances of the FEC system 904. The post-FEC correlated performance metric are metrics that correlate well with post-FEC BER performance. The controller 902 can dynamically adapt the FEC-related parameters of the FEC system 904 to optimize the post-FEC BER performance. The FEC-related parameters can be encoding/decoding layer parameters. In at least one embodiment, the FEC-related parameters includes an interleave factor (RSIL). In at least one embodiment, the controller 902 can receive the FEC symbol error data 992 from the decoding layer 906c of the FEC system 104. In particular, the controller 902 can receive the first FEC decoder 922 from the fourth interleaver 942 (RSILD), as described above with respect to FIG. 1A. The controller 902 can determine a post-FEC correlated performance metric using the FEC symbol error data 992. The controller 902 can adapt encoding/decoding layer parameters (FEC-related parameters) and/or SerDes parameters (also referred to as link parameters) using the post-FEC correlated performance metric.

In at least one embodiment, the controller 902 can adapt (i) FEC-related parameters, such as the interleave factor to optimize post-FEC BER performance through the use of different post-FEC correlated performance metrics reflective of post-FEC BER performance. In at least one embodiment, the controller 902 can adapt (ii) link parameters, such as SerDes parameters, to optimize post-FEC BER performance through the use of different post-FEC correlated performance metrics reflective of post-FEC BER performance. The different post-FEC correlated performance metrics, also referred to as adaptation metrics, can be (i) based on a codeword histogram difference metric. The codeword histogram difference metric can be computed by comparing measured FEC codeword histogram to a desired target histogram. The different post-FEC correlated performance metrics can be (ii) based on FEC symbol error auto-correlation function (ACF).

Referring to FIG. 9C, in at least one embodiment, the controller 902 can receive the FEC symbol error data 994 from the third interleaver 924 (BCHILD). For example, generating a e_bchild(n) and fe_bchild(n) would be useful if one wanted to adapt BCHIL or otherwise adapt SerDes parameters by examining behavior at the output of the BCHILD (e.g., third interleaver 924). FEC symbol error data 994 would be denoted by fe_bchild(n). The controller 902 can determine a post-FEC correlated performance metric using only the FEC symbol error data 994 or both the FEC symbol error data 992 and FEC symbol error data 994. The controller 902 can adapt encoding/decoding layer parameters (FEC-related parameters) and/or SerDes parameters (also referred to as link parameters) using the post-FEC correlated performance metric.

Referring to FIG. 9C, in at least one embodiment, the controller 902 can receive the FEC symbol error data 996 from the receiver circuit 914 (SerDes output). The controller 902 can determine a post-FEC correlated performance metric using only the FEC symbol error data 996. The controller 902 can determine a post-FEC correlated performance metric using the FEC symbol error data 996 and FEC symbol error data 994. The controller 902 can determine a post-FEC correlated performance metric using the FEC symbol error data 996 and FEC symbol error data 992. The controller 902 can determine a post-FEC correlated performance metric using the FEC symbol error data 996, FEC symbol error data 994, and the FEC symbol error data 992. The controller 902 can adapt encoding/decoding layer parameters (FEC-related parameters) and/or SerDes parameters (also referred to as link parameters) using the post-FEC correlated performance metric.

As described above, additional metrics can be generated based on the output of the BCHILD or combinations thereof of the SerDes output, BCHILD output, and/or RSILD output.

FIG. 10 is a flow diagram of a method 1000 for adjusting at least one of an FEC parameter or a link parameter to reduce a post-FEC BER performance according to at least one embodiment. In at least one embodiment, the method 1000 is performed by controller 102 of FIG. 1A. In at least one embodiment, the method 1000 is performed by controller 902 of FIG. 9A. In at least one embodiment, the method 1000 is performed by a first device communicating with a second device over a communication channel.

Referring to FIG. 10, the method 1000 begins with the processing logic receiving forward error correction (FEC) symbol error data from an FEC system coupled to a receiver circuit (block 1002). At block 1004, the processing logic determines, using the FEC symbol error data, a post-FEC correlated performance metric indicative of a post-FEC bit error rate (BER) of the FEC system. At block 1006, the processing logic adjusts at least one of an FEC parameter of the FEC system or a link parameter of the receiver circuit to reduce the post-FEC BER of the FEC system.

In a further embodiment, at block 1004, the processing logic determines a codeword histogram difference metric by comparing a measured FEC codeword histogram and a target histogram. In this embodiment, the codeword histogram difference metric is the post-FEC correlated performance metric.

In a further embodiment, at block 1004, the processing logic determines the post-FEC correlated performance metric using an FEC symbol error auto-correlation function.

In a further embodiment, at block 1006, the processing logic changes an interleave factor of an interleaver of the FEC system from a first value to a second value.

In a further embodiment, at block 1006, the processing logic changes a first interleave factor of a first interleaver of the FEC system from a first value to a second value and changes a second interleave factor of a second interleaver of the FEC system from a third value to a fourth value.

In a further embodiment, the receiver circuit is a SerDes circuit, and, at block 1006, the processing logic changes a phase noise parameter of a PLL of the SerDes circuit from a first value to a second value.

In a further embodiment, the receiver circuit is a SerDes circuit, and, at block 1006, the processing logic changes an interleave factor of an interleaver of the FEC system from a first value to a second value, and changes a phase noise parameter of a PLL of the SerDes circuit from a third value to a fourth value.

Figure 11A:
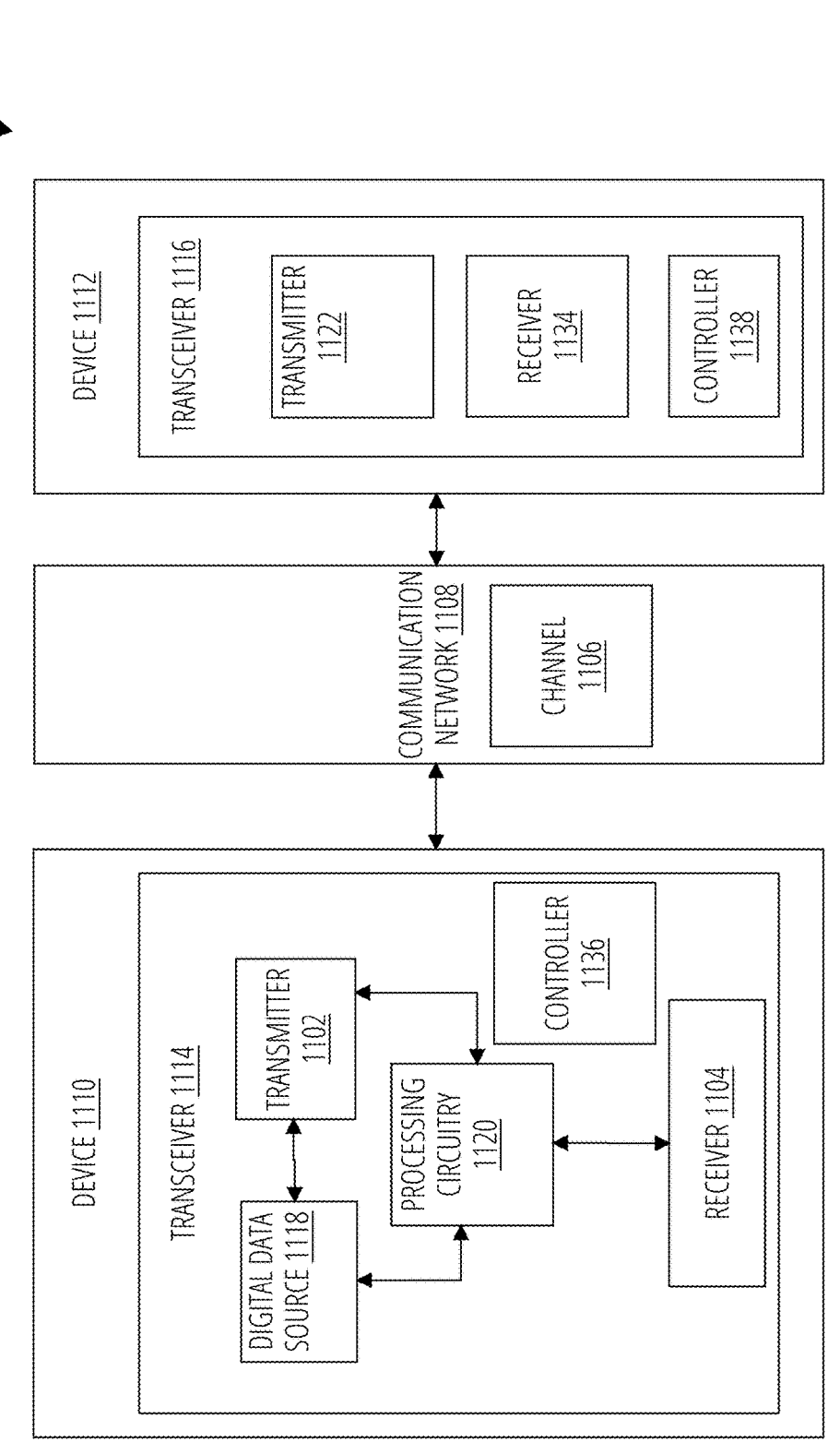
FIG. 11A illustrates an example communication system with a controller for optimizing post-FEC BER performance of an FEC system, in accordance with at least some embodiments.

FIG. 11A illustrates an example communication system 1100 with a controller 1136 for optimizing post-FEC BER performance of an FEC system, in accordance with at least some embodiments. The communication system 1100 includes a device 1110, a communication network 1108 including a communication channel 1106, and a device 1112. In at least one embodiment, the devices 1110 and 1112 are integrated circuits of a Personal Computer (PC), a laptop, a tablet, a smartphone, a server, a collection of servers, or the like. In some embodiments, the devices 1110 and 1112 may correspond to any appropriate type of device that communicates with other devices also connected to a common type of communication network 1108. According to embodiments, the transmitter 1102 and 1122 of devices 1110 or 1112 may correspond to transmitters of a Graphics Processing Unit (GPU), a switch (e.g., a high-speed network switch), a network adapter, a central processing unit (CPU), a data processing unit (DPU), etc.

Examples of the communication network 1108 that may be used to connect the devices 1110 and 1112 include wires, conductive traces, bumps, terminals, optical fibers, or the like. In one specific, but non-limiting example, the communication network 1108 is a network that enables data transmission between the devices 1110 and 1112 using data signals (e.g., digital, optical, wireless signals), clock signals, or both.

The device 1110 includes a transceiver 1114 for sending and receiving signals, for example, data signals. The data signals may be digital or optical signals modulated with data or other suitable signals for carrying data.

The transceiver 1114 may include a digital data source 1118, a transmitter 502, a receiver 1104, and processing circuitry 1120 that controls the transceiver 1114. The digital data source 1118 may include suitable hardware and/or software for outputting data in a digital format (e.g., in binary code and/or thermometer code). The digital data output by the digital data source 1118 may be retrieved from memory (not illustrated) or generated according to input (e.g., user input). The transceiver 1114 can include the controller 1136 as described above with respect to FIG. 1A to FIG. 10. In at least one embodiment, the controller 1136 is the controller 102 of FIG. 1A. In another embodiment, the controller 1136 is the controller 902 of FIG. 9A.

The transceiver 1114 includes suitable software and/or hardware for receiving digital data from the digital data source 1118 and outputting data signals according to the digital data for transmission over the communication network 1108 to a transceiver 1116 of device 1112.

The receiver 1104 of device 1110 may include suitable hardware and/or software for receiving signals, for example, data signals from the communication network 1108. For example, the receiver 1104 may include components for receiving processing signals to extract the data for storing in a memory. In at least one embodiment, the transceiver 1116 includes a transmitter 1122 and receive 1134. The transceiver 1116 receives an incoming signal and samples the incoming signal to generate samples, such as using an analog-to-digital converter (ADC). The ADC can be controlled by a clock-recovery circuit (or clock recovery block) in a closed-loop tracking scheme. The clock-recovery circuit can include a controlled oscillator, such as a voltage-controlled oscillator (VCO) or a digitally-controlled oscillator (DCO) that controls the sampling of the subsequent data by the ADC. The transceiver 1116 can include the controller 1138 as described above with respect to FIG. 1A to FIG. 10. In at least one embodiment, the controller 1138 is the controller 102 of FIG. 1A. In another embodiment, the controller 1138 is the controller 902 of FIG. 9A.

The processing circuitry 1120 may comprise software, hardware, or a combination thereof. For example, the processing circuitry 1120 may include a memory including executable instructions and a processor (e.g., a microprocessor) that executes the instructions on the memory. The memory may correspond to any suitable type of memory device or collection of memory devices configured to store instructions. Non-limiting examples of suitable memory devices that may be used include Flash memory, Random Access Memory (RAM), Read Only Memory (ROM), variants thereof, combinations thereof, or the like. In some embodiments, the memory and processor may be integrated into a common device (e.g., a microprocessor may include integrated memory). Additionally or alternatively, the processing circuitry 1120 may comprise hardware, such as an Application-Specific Integrated circuit (ASIC). Other non-limiting examples of the processing circuitry 1120 include an Integrated Circuit (IC) chip, a CPU, A GPU, a DPU, a microprocessor, a Field-Programmable Gate Array (FPGA), a collection of logic gates or transistors, resistors, capacitors, inductors, diodes, or the like. Some or all of the processing circuitry 1120 may be provided on a Printed Circuit Board (PCB) or collection of PCBs. It should be appreciated that any appropriate type of electrical component or collection of electrical components may be suitable for inclusion in the processing circuitry 1120. The processing circuitry 1120 may send and/or receive signals to and/or from other elements of the transceiver 1114 to control the overall operation of the transceiver 1114.

The transceiver 1114 or selected elements of the transceiver 1114 may take the form of a pluggable card or controller for the device 1110. For example, the transceiver 1114 or selected elements of the transceiver 1114 may be implemented on a network interface card (NIC).

The device 1112 may include a transceiver 1116 for sending and receiving signals, for example, data signals over a channel 1106 of the communication network 1108. The same or similar structure of the transceiver 1114 may be applied to transceiver 1116, and thus, the structure of transceiver 1116 is not described separately.

Although not explicitly shown, it should be appreciated that devices 1110 and 1112 and the transceiver 1114 and transceiver 1116 may include other processing devices, storage devices, and/or communication interfaces generally associated with computing tasks, such as sending and receiving data.

Figure 11B:
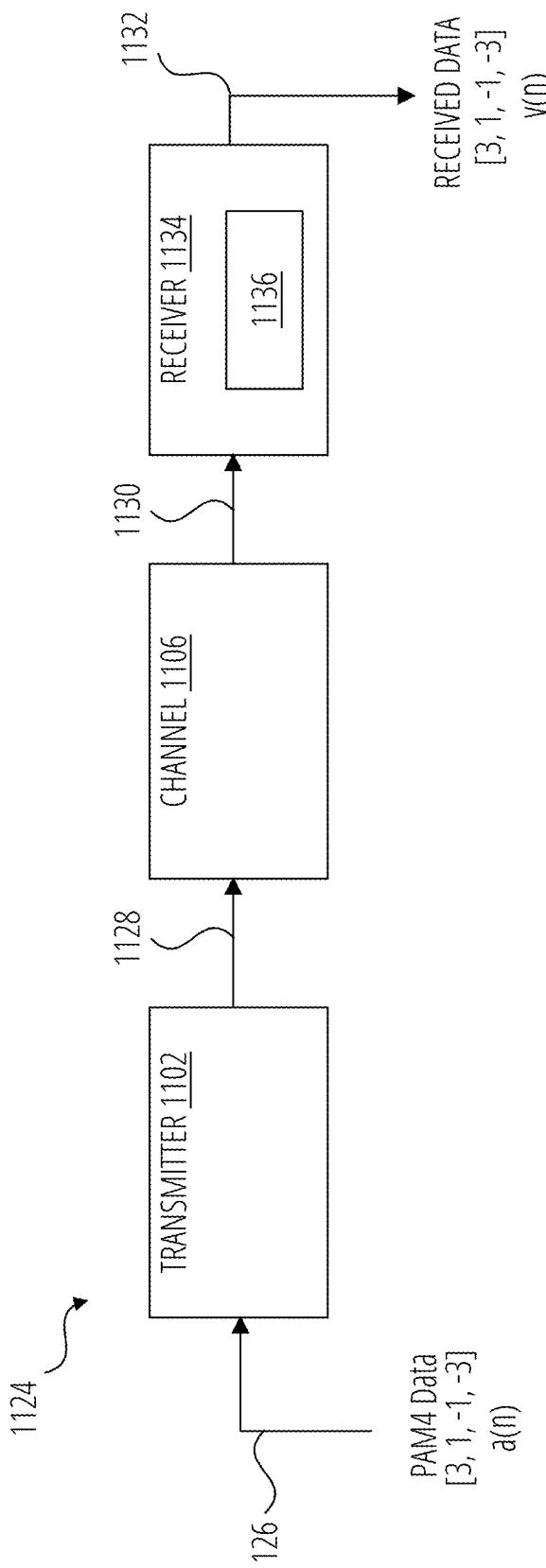
FIG. 11B illustrates a block diagram of an example communication system employing a receiver with a controller for optimizing post-FEC BER performance of an FEC system, according to at least one embodiment.

FIG. 11B illustrates a block diagram of an example communication system 1124 employing a receiver 1134 with a controller 1136 for optimizing post-FEC BER performance of an FEC system, according to at least one embodiment. In the example shown in FIG. 11B, a Pulse Amplitude Modulation level-4 (PAM4) modulation scheme is employed with respect to the transmission of a signal (e.g., digitally encoded data) from a transmitter (TX) 1102 to a receiver (RX) 1134 via a communication channel 1106 (e.g., a transmission medium). In this example, the transmitter 1102 receives an input data 1126 (i.e., the input data at time n is represented as "a(n)"), which is modulated in accordance with a modulation scheme (e.g., PAM4) and sends the signal 1128 a(n) including a set of data symbols (e.g., symbols −3, −1, 1, 3, where the symbols represent coded binary data). It is noted that while the use of the PAM4 modulation scheme is described herein by way of example, other data modulation schemes can be used in accordance with embodiments of the present disclosure, including for example, a non-return-to-zero (NRZ) modulation scheme, PAM7, PAM8, PAM16, etc. For example, for an NRZ-based system, the transmitted data symbols consist of symbols −1 and 1, with each symbol value representing a binary bit. This is also known as a PAM level-2 or PAM2 system as there are 2 unique values of transmitted symbols. Typically, a binary bit 0 is encoded as −1, and a bit 1 is encoded as 1 as the PAM2 values.

In the example shown, the PAM4 modulation scheme uses four (4) unique values of transmitted symbols to achieve higher efficiency and performance. The four levels are denoted by symbol values −3, −1, 1, 3, with each symbol representing a corresponding unique combination of binary bits (e.g., 00, 01, 10, 11).

The communication channel 1106 is a destructive medium in that the channel acts as a low pass filter which attenuates higher frequencies more than it attenuates lower frequencies, introduces inter-symbol interference (ISI) and noise from cross talk, from power supplies, from Electromagnetic Interference (EMI), or from other sources. The communication channel 1106 can be over serial links (e.g., a cable, PCB traces, copper cables, optical fibers, or the like), read channels for data storage (e.g., hard disk, flash solid-state drives (SSDs), high-speed serial links, deep space satellite communication channels, applications, or the like. The receiver (RX) 1134 receives an incoming signal 1130 over the channel 1106. The receiver 1134 can output a received signal 1132, "v(n)," including the set of data symbols (e.g., symbols −3, −1, 1, 3, wherein the symbols represent coded binary data).

In at least one embodiment, the transmitter 1102 can be part of a SerDes IC. The SerDes IC can be a transceiver that converts parallel data to serial data and vice versa. The SerDes IC can facilitate transmission between two devices over serial streams, reducing the number of data paths, wires/traces, terminals, etc. The receiver 1134 can be part of a SerDes IC. The SerDes IC can include a clock-recovery circuit. The clock-recovery circuit can be coupled to an ADC and an equalization block. In another embodiment, the SerDes IC can include additional equalization block before a symbol detector.

Figure 12:
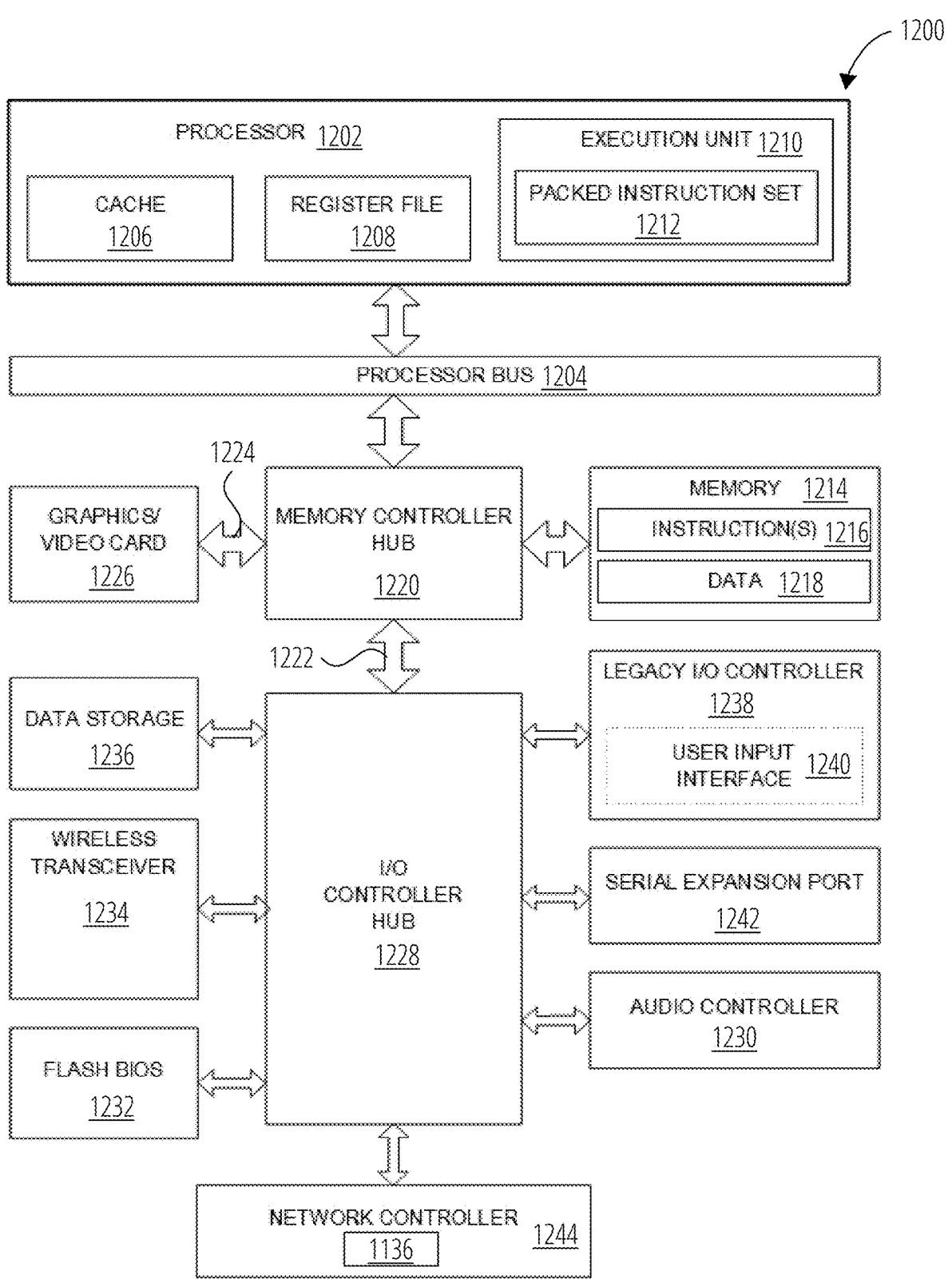
FIG. 12 illustrates an example computer system, including a network controller with a controller for optimizing post-FEC BER performance of an FEC system, in accordance with at least some embodiments.

FIG. 12 illustrates an example computer system 1200, including a network controller 1244 with a controller 1136 for optimizing post-FEC BER performance of an FEC system, in accordance with at least some embodiments. In at least one embodiment, computer system 1200 may be a system with interconnected devices and components, a System on Chip (SoC), or some combination. In at least one embodiment, computer system 1200 is formed with a processor 1202 that may include execution units to execute an instruction. In at least one embodiment, computer system 1200 may include, without limitation, a component, such as a processor 1202, to employ execution units including logic to perform algorithms for processing data. In at least one embodiment, computer system 1200 may include processors, such as PENTIUM® Processor family, Xeon™, Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, computer system 1200 may execute a version of WINDOWS' operating system available from Microsoft Corporation of Redmond, Wash., although other operating systems (UNIX and Linux, for example), embedded software, and/or graphical user interfaces, may also be used.

In at least one embodiment, computer system 1200 may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor (DSP), an SoC, network computers ("NetPCs"), set-top boxes, network hubs, wide area network ("WAN") switches, or any other system that may perform one or more instructions. In an embodiment, computer system 1200 may be used in devices such as graphics processing units (GPUs), network adapters, central processing units, and network devices such as switches (e.g., a high-speed direct GPU-to- GPU interconnect such as the NVIDIA GH100 NVLINK or the NVIDIA Quantum 2 64 Ports InfiniBand NDR Switch).

In at least one embodiment, computer system 1200 may include, without limitation, processor 1202 that may include, without limitation, one or more execution units 807 that may be configured to execute a Compute Unified Device Architecture ("CUDA") (CUDA® is developed by NVIDIA Corporation of Santa Clara, California) program. In at least one embodiment, a CUDA program is at least a portion of a software application written in a CUDA programming language. In at least one embodiment, computer system 1200 is a single processor desktop or server system. In at least one embodiment, computer system 1200 may be a multiprocessor system. In at least one embodiment, processor 1202 may include, without limitation, a complex instruction set computer (CISC) microprocessor, a reduced instruction set computer (RISC) microprocessor, a Very Long Instruction Word (VLIW) microprocessor, and a processor implementing a combination of instruction sets, or any other processor device, such as a digital signal processor, for example. In at least one embodiment, processor 1202 may be coupled to a processor bus 1204 that may transmit data signals between processor 1202 and other components in computer system 1200.

In at least one embodiment, processor 1202 may include, without limitation, a Level 1 ("L1") internal cache memory ("cache") 1206. In at least one embodiment, processor 1202 may have a single internal cache or multiple levels of internal cache. In at least one embodiment, cache memory may reside external to processor 1202. In at least one embodiment, processor 1202 may also include a combination of both internal and external caches. In at least one embodiment, a register file 1208 may store different types of data in various registers including, without limitation, integer registers, floating point registers, status registers, and instruction pointer register.

In at least one embodiment, execution unit 1210, including, without limitation, logic to perform integer and floating point operations, also resides in processor 1202. Processor 1202 may also include a microcode ("ucode") read only memory ("ROM") that stores microcode for certain macro instructions. In at least one embodiment, execution unit 1210 may include logic to handle a packed instruction set 1212. In at least one embodiment, by including packed instruction set 1212 in an instruction set of a general-purpose processor 1202, along with associated circuitry to execute instructions, operations used by many multimedia applications may be performed using packed data in a general-purpose processor 1202. In at least one embodiment, many multimedia applications may be accelerated and executed more efficiently by using full width of a processor's data bus for performing operations on packed data, which may eliminate a need to transfer smaller units of data across a processor's data bus to perform one or more operations one data element at a time.

In at least one embodiment, execution unit 1210 may also be used in microcontrollers, embedded processors, graphics devices, DSPs, and other types of logic circuits. In at least one embodiment, computer system 1200 may include, without limitation, a memory 1214. In at least one embodiment, memory 1214 may be implemented as a Dynamic Random Access Memory (DRAM) device, a Static Random Access Memory (SRAM) device, flash memory device, or other memory devices. Memory 1214 may store instruction(s) 1216 and/or data 1218 represented by data signals that may be executed by processor 1202.

In at least one embodiment, a system logic chip may be coupled to a processor bus 1204 and memory 1214. In at least one embodiment, the system logic chip may include, without limitation, a memory controller hub ("MCH") 1220, and processor 1202 may communicate with MCH 1220 via processor bus 1204. In at least one embodiment, MCH 1220 may provide a high bandwidth memory path to memory 1214 for instruction and data storage and for storage of graphics commands, data, and textures. In at least one embodiment, MCH 1220 may direct data signals between processor 1202, memory 1214, and other components in computer system 1200 and may bridge data signals between processor bus 1204, memory 1214, and a system I/O 1222. In at least one embodiment, a system logic chip may provide a graphics port for coupling to a graphics controller. In at least one embodiment, MCH 1220 may be coupled to memory 1214 through high bandwidth memory path, and graphics/video card 1226 may be coupled to MCH 1220 through an Accelerated Graphics Port ("AGP") interconnect 1224.

In at least one embodiment, computer system 1200 may use system I/O 1222 that is a proprietary hub interface bus to couple MCH 1220 to I/O controller hub ("ICH") 1228. In at least one embodiment, ICH 1228 may provide direct connections to some I/O devices via a local I/O bus. In at least one embodiment, a local I/O bus may include, without limitation, a high-speed I/O bus for connecting peripherals to memory 1214, a chipset, and processor 1202. Examples may include, without limitation, an audio controller 1230, a firmware hub ("flash BIOS") 1232, a wireless transceiver 1234, a data storage 1236, a legacy I/O controller 1238 containing a user input interface 1240, a keyboard interface, a serial expansion port 1242, such as a USB port, and a network controller 644, including the controller 1136 as described herein. Data storage 1236 may comprise a hard disk drive, a floppy disk drive, a CD-ROM device, a flash memory device, or other mass storage device.

In at least one embodiment, FIG. 12 illustrates a computer system 120000, which includes interconnected hardware devices or "chips." In at least one embodiment, FIG. 12 may illustrate an example SoC. In at least one embodiment, devices illustrated in FIG. 12 may be interconnected with proprietary interconnects, standardized interconnects (e.g., Peripheral Component Interconnect Express (PCIe), or some combination thereof. In at least one embodiment, one or more components of computer system 1200 are interconnected using compute express link ("CXL") interconnects.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under the control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, the terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As a non-limiting example, a "processor" may be a network device. A "computing platform" may comprise one or more processors. As used herein, "software" processes may include, for example, software and/or hardware entities that perform work over time, such as tasks, threads, and intelligent agents. Also, each process may refer to multiple processes for continuously or intermittently carrying out instructions in sequence or in parallel. In at least one embodiment, the terms "system" and "method" are used herein interchangeably insofar as the system may embody one or more methods and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or an inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A communication system comprising:
a receiver circuit;
a Forward Error Correction (FEC) circuit operatively coupled to the receiver circuit; and
a controller operatively coupled to the receiver circuit and the FEC circuit, wherein the controller is to:
receive first FEC symbol error data from the receiver circuit;
receive second FEC symbol error data from the FEC circuit;
compare a first measured histogram based on the first FEC symbol error data against a first target histogram to generate a first difference metric;
compare a second measured histogram based on the second FEC symbol error data against a second target histogram to generate a second difference metric; and
adjust a link parameter of the receiver circuit based on the first difference metric and adjust an FEC parameter of the FEC circuit based on the second difference metric to reduce a post-FEC bit error rate (BER) of the FEC circuit.

2. The communication system of claim 1, wherein the controller is further to adjust the link parameter and the FEC parameter sequentially.

3. The communication system of claim 1, wherein the controller is further to adjust the link parameter and the FEC parameter jointly.

4. The communication system of claim 1, wherein:
the FEC circuit comprises:
an interleaver; and
a decoder;
the FEC parameter is an interleave factor of the interleaver; and
the controller, to adjust the FEC parameter, is to change the interleave factor from a first value to a second value.

5. The communication system of claim 1, wherein the receiver circuit comprises a serializer/deserializer (SerDes) circuit, wherein:
the SerDes circuit comprises a phase-locked loop (PLL);
the link parameter is a phase noise parameter of the PLL; and
the controller, to adjust the link parameter, is to change the phase noise parameter from a first value to a second value.

6. The communication system of claim 1, wherein the receiver circuit comprises a serializer/deserializer (SerDes) circuit, wherein:
the FEC circuit comprises an interleaver;
the SerDes circuit comprises a phase-locked loop (PLL);
the FEC parameter is an interleave factor of the interleaver;
the link parameter is a phase noise parameter of the PLL;
the controller, to adjust the FEC parameter, is to change the interleave factor from a first value to a second value; and
the controller, to adjust the link parameter, is to change the phase noise parameter from a third value to a fourth value.

7. The communication system of claim 1, further comprising:
a receiver comprising the receiver circuit, the FEC circuit, and the controller; and
a transmitter comprising a second FEC circuit, wherein the controller is further to send an indication to the second FEC circuit, the indication to adjust an FEC parameter of the second FEC circuit.

8. The communication system of claim 1, wherein:
the FEC circuit comprises:
a first interleaver;
a first decoder;
a second interleaver;
a second decoder;
the FEC parameter is a first interleave factor of the first interleaver, and the second interleaver comprises a second interleave factor; and
the controller, to adjust the FEC parameter, is to:
change the first interleave factor from a first value to a second value; and
change the second interleave factor from a third value to a fourth value.

9. The communication system of claim 1, wherein the second FEC symbol error data comprises a number of corrected FEC symbols per codeword received from a decoder of the FEC circuit, and wherein the controller is to:
generate a measured approximate FEC codeword histogram based on the number of corrected FEC symbols per codeword, wherein the measured approximate FEC codeword histogram is the second measured histogram.

10. The communication system of claim 9, wherein the measured approximate FEC codeword histogram is generated without transmitting a training pattern.

11. A method comprising:

receiving first Forward Error Correction (FEC) symbol error data from a receiver circuit;

receiving second FEC symbol error data from an FEC system coupled to the receiver circuit;

comparing a first measured histogram based on the first FEC symbol error data against a first target histogram to generate a first difference metric;

comparing a second measured histogram based on the second FEC symbol error data against a second target histogram to generate a second difference metric; and adjusting a link parameter of the receiver circuit based on the first difference metric and adjusting an FEC parameter of the FEC system based on the second difference metric to reduce a post-FEC bit error rate (BER) of the FEC system.

12. The method of claim 11, wherein adjusting the link parameter and adjusting the FEC parameter are performed sequentially.

13. The method of claim 11, wherein adjusting the link parameter and adjusting the FEC parameter are performed jointly.

14. The method of claim 11, wherein adjusting the FEC parameter comprises changing an interleave factor of an interleaver of the FEC system from a first value to a second value.

15. The method of claim 11, wherein adjusting the FEC parameter comprises:

changing a first interleave factor of a first interleaver of the FEC system from a first value to a second value; and changing a second interleave factor of a second interleaver of the FEC system from a third value to a fourth value.

16. The method of claim 11, wherein the receiver circuit is a Serializer/Deserializer (SerDes) circuit, wherein adjusting the link parameter comprises changing a phase noise parameter of a phase-locked loop (PLL) of the SerDes circuit from a first value to a second value.

17. The method of claim 11, wherein the receiver circuit is a Serializer/Deserializer (SerDes) circuit, wherein adjusting the FEC parameter comprises changing an interleave factor of an interleaver of the FEC system from a first value to a second value; and wherein adjusting the link parameter comprises changing a phase noise parameter of a phase-locked loop (PLL) of the SerDes circuit from a third value to a fourth value.

18. The method of claim 11, wherein the second FEC symbol error data comprises a number of corrected FEC symbols per codeword received from a decoder of the FEC system, and wherein the method further comprises:

generating a measured approximate FEC codeword histogram based on the number of corrected FEC symbols per codeword, wherein the measured approximate FEC codeword histogram is the second measured histogram.

19. The method of claim 18, wherein the measured approximate FEC codeword histogram is generated without transmitting a training pattern.

20. A communication system comprising:

a Serializer/Deserializer (SerDes) circuit coupled to a communication channel;

a Forward Error Correction (FEC) system operatively coupled to the SerDes circuit; and a controller operatively coupled to the SerDes circuit and the FEC system, wherein the controller is to:

receive first FEC symbol error data from the SerDes circuit;

receive second FEC symbol error data from the FEC system;

compare a first measured histogram based on the first FEC symbol error data against a first target histogram to generate a first difference metric;

compare a second measured histogram based on the second FEC symbol error data against a second target histogram to generate a second difference metric; and change one or more parameters of the FEC system and one or more parameters of the SerDes circuit.

21. The communication system of claim 20, wherein the controller is further to adjust the one or more parameters of the FEC system and the one or more parameters of the SerDes circuit sequentially.

22. The communication system of claim 20, wherein the controller is further to adjust the one or more parameters of the FEC system and the one or more parameters of the SerDes circuit jointly.

23. The communication system of claim 20, wherein:

the FEC system comprises:

an interleaver; and a decoder;

the one or more parameters of the FEC system comprise an interleave factor of the interleaver; and the controller, to change the one or more parameters of the FEC system, is to change the interleave factor from a first value to a second value.

24. The communication system of claim 20, wherein the FEC system comprises:

a first interleaver;

a first decoder;

a second interleaver;

a second decoder;

the one or more parameters of the FEC system comprise a first interleave factor of the first interleaver and a second interleave factor of the second interleaver; and the controller, to change the one or more parameters of the FEC system, is to:

change the first interleave factor from a first value to a second value; and change the second interleave factor from a third value to a fourth value.

25. The communication system of claim 20, wherein the second FEC symbol error data comprises a number of corrected FEC symbols per codeword received from a decoder of the FEC system, and wherein the controller is to:

generate a measured approximate FEC codeword histogram based on the number of corrected FEC symbols per codeword, wherein the measured approximate FEC codeword histogram is the second measured histogram.

26. The communication system of claim 25, wherein the measured approximate FEC codeword histogram is generated without transmitting a training pattern.

* * * * *